(12) United States Patent
Miki et al.

(10) Patent No.: US 8,813,832 B2
(45) Date of Patent: Aug. 26, 2014

(54) HEAT SINK

(75) Inventors: Keiji Miki, Hyogo (JP); Kenji Ando, Hyogo (JP)

(73) Assignee: Sumitomo Precision Products Co., Ltd., Hyogo (JP)

( * ) Notice: Subject to any disclaimer, the term of this patent is extended or adjusted under 35 U.S.C. 154(b) by 0 days.

(21) Appl. No.: 13/257,387

(22) PCT Filed: Mar. 12, 2010

(86) PCT No.: PCT/JP2010/001800
§ 371 (c)(1),
(2), (4) Date: Sep. 19, 2011

(87) PCT Pub. No.: WO2010/109799
PCT Pub. Date: Sep. 30, 2010

(65) Prior Publication Data
US 2012/0012294 A1      Jan. 19, 2012

(30) Foreign Application Priority Data
Mar. 24, 2009   (JP) .................................. 2009-071340

(51) Int. Cl.
*B60H 3/00* (2006.01)
*F28F 1/30* (2006.01)
*F28F 1/14* (2006.01)
*B61C 17/00* (2006.01)
*H05K 7/20* (2006.01)
*H01L 23/467* (2006.01)

(52) U.S. Cl.
CPC ............... *B61C 17/00* (2013.01); *H05K 7/209* (2013.01); *H01L 23/467* (2013.01); *Y02T 30/10* (2013.01)

USPC .............. 165/44; 165/182; 165/183; 165/184

(58) Field of Classification Search
USPC .................................................... 165/44, 185
See application file for complete search history.

(56) References Cited

U.S. PATENT DOCUMENTS 4,917,336 A * 4/1990 Jacobs et al. .................. 244/207
5,158,136 A * 10/1992 Azar .............................. 165/185
(Continued)

FOREIGN PATENT DOCUMENTS

JP          02-052491           4/1990
JP          04-056155 A         2/1992
(Continued)

OTHER PUBLICATIONS

JP2007-134471-xlation, May 2007, Japan.*
(Continued)

*Primary Examiner* — Alexandra Elve
*Assistant Examiner* — Henry Crenshaw
(74) *Attorney, Agent, or Firm* — Renner, Otto, Boisselle & Sklar, LLP

(57) ABSTRACT

A heat sink which is mounted in a movable body and which is to be exposed to a traveling air stream generated while the movable body moves includes a base and a heat dissipating portion having a plurality of fins. At least in a front end portion of the heat dissipating portion, the heat dissipating portion includes a rectifying portion provided so as to extend across a predetermined area in a longitudinal direction in front portions of slit-shaped flow paths at an upstanding end (i.e., an end apart from the base).

12 Claims, 15 Drawing Sheets

(56) References Cited

U.S. PATENT DOCUMENTS

| | | | |
|---|---|---|---|
| 7,370,692 B2 * | 5/2008 | Wei | 165/80.3 |
| 2004/0159421 A1 * | 8/2004 | Wang | 165/80.3 |
| 2006/0011324 A1 * | 1/2006 | Rogers et al. | 165/80.3 |
| 2006/0164808 A1 * | 7/2006 | Stefanoski | 361/700 |
| 2008/0074845 A1 | 3/2008 | Sun et al. | |
| 2010/0018691 A1 * | 1/2010 | Ohgami et al. | 165/185 |
| 2011/0272127 A1 * | 11/2011 | Melo et al. | 165/185 |

FOREIGN PATENT DOCUMENTS

| | | | |
|---|---|---|---|
| JP | 05-036887 | | 5/1993 |
| JP | 05-259325 A | | 10/1993 |
| JP | H05-259325 | * | 10/1993 |
| JP | 2000-092819 A | | 3/2000 |
| JP | 2000-294695 | | 10/2000 |
| JP | 2001-118972 | | 4/2001 |
| JP | 2001-332883 A | | 11/2001 |
| JP | 2001-332883 | * | 12/2001 |
| JP | 2003-048533 | | 2/2003 |
| JP | 2003-258471 A | | 9/2003 |
| JP | 2006-224796 A | | 8/2006 |
| JP | 2006-278923 A | | 10/2006 |
| JP | 2007-134471 | * | 5/2007 |
| JP | 2007-134471 A | | 5/2007 |
| JP | 2007134471 A | * | 5/2007 |
| JP | H05-259325 | * | 11/2009 |

OTHER PUBLICATIONS

JP 2007134471 xlation, May 2007, Japan, Kanda, Atsushi.*
JP2001-332883 xlation, Dec. 2001, Japan, Ishida.*
International Search Report for corresponding International Application No. PCT/JP2010/001800 mailed May 18, 2010.
Form PCT-ISA-237 for corresponding International Application No. PCT/JP2010/001800 dated May 18, 2010.
Supplementary European Search Report for corresponding European Application No. EP 10 75 5603 dated Oct. 10, 2012.

* cited by examiner

HEAT SINK

TECHNICAL FIELD

A technique disclosed herein particularly relates to a heat sink mounted in a movable body and configured to cool a heating element by being exposed to a traveling air stream generated while the movable body moves.

BACKGROUND ART

For example, Patent Documents 1 and 2 disclose a heat sink arranged under a floor of a railway vehicle and used for cooling a power converter for driving the vehicle. The heat sink includes a base to which a power semiconductor device which is a heating element is attached, and a heat dissipating portion having a plurality of fins each vertically arranged on the base. The heat sink is exposed to a traveling air stream generated while the vehicle travels, and therefore heat of the power semiconductor device is dissipated by heat transfer through each of the fins.

CITATION LIST

Patent Document

PATENT DOCUMENT 1: Japanese Patent Publication No. 2000-092819
PATENT DOCUMENT 2: Japanese Patent Publication No. 2001-332883

SUMMARY OF THE INVENTION

Technical Problem

The heat sink using the traveling air stream is advantageous to energy saving as compared to forced air cooling which uses, e.g., a blower. However, a state of the traveling air stream to be injected to the heat sink depends on a traveling state of the vehicle, and the sufficient traveling air stream is not always supplied to the heat sink. Thus, it is preferred that cooling efficiency of the heat sink is improved in order to ensure cooling of the heating element.

In, e.g., the heat sinks of Patent Documents 1 and 2, the improvement of the cooling efficiency has been attempted by devising arrangement of the fins or a shape of the fin. However, in fact, the cooling efficiency is not sufficiently improved in the foregoing heat sinks.

In a heat sink disclosed herein, which is mounted in a movable body and is configured to cool a heating element by being exposed to a traveling air stream, cooling efficiency thereof is improved.

Solution to the Problem

Regarding improvement of cooling efficiency of a heat sink, the inventors of the present invention have focused on an airflow in a flow path between fins formed in the heat sink. That is, in the heat sink, the fins each vertically arranged on a base extend from a front end corresponding to an upstream end in a flow direction of a traveling air stream to a rear end corresponding to a downstream end in a longitudinal direction, and are arranged so as to be apart from each other at a predetermined interval in an arrangement direction perpendicular to the longitudinal direction. As a result, a plurality of slit-shaped flow paths opening at the front end, the rear end, and an upstanding end (i.e., an end apart from the base) of the fin are each formed so as to extend in the longitudinal direction between adjacent fins. The inventors of the present invention have found that a velocity of the airflow in the slit-shaped flow path is gradually decreased as air flows from upstream the slit-shaped flow path (i.e., a front end side) in the flow direction toward downstream the slit-shaped flow path (i.e., a rear end side). The decrease in airflow velocity on the rear end side particularly degrades heat dissipation of a heating element arranged on the rear end side, resulting in degradation of the cooling efficiency of the heat sink. The inventors of the present invention have extensively conducted research on how the decrease in airflow velocity in the flow direction in the slit-shaped flow path is suppressed. Consequently, the inventors of the present invention have found that a rectifying portion which can change conditions for an airflow into the slit-shaped flow path is attached near the upstream end (i.e., the front end) of the fin, and therefore the decrease in airflow velocity as air flows toward the rear end side can be suppressed.

A heat sink disclosed herein is mounted in a movable body and is to be exposed to a traveling air stream generated while the movable body moves. The heat sink includes a base which has an attachment surface and a heat dissipation surface and to which at least one heating element is attached at the attachment surface; and a heat dissipating portion including a plurality of fins each vertically arranged on the heat dissipation surface of the base.

Each of the plurality of fins extends from a base end contacting the heat dissipation surface to an upstanding end so as to protrude from the heat dissipation surface, and extends in a longitudinal direction from a front end corresponding to an upstream end in a flow direction of the traveling air stream to a rear end corresponding to a downstream end. In the heat dissipating portion, the plurality of fins are arranged so as to be apart from each other at a predetermined interval in an arrangement direction perpendicular to the longitudinal direction, and a plurality of slit-shaped flow paths opening at the front end, the rear end, and the upstanding end of the plurality of fins are formed so that each of the plurality of slit-shaped flow paths extends in the longitudinal direction between adjacent ones of the plurality of fins. The heat dissipating portion further includes a rectifying portion which is provided so as to extend across a predetermined area in the longitudinal direction in front portions of the plurality of fins at the upstanding end.

The rectifying portion provided near a front end of the heat dissipating portion suppresses a decrease in airflow velocity in the slit-shaped flow path as air flows toward the rear end. A function to suppress the decrease in airflow velocity in the slit-shaped flow path is advantageous to the improvement of the cooling efficiency of the heat sink.

The rectifying portion may be a closing portion extending from the front portions of the plurality of fins at the upstanding end toward back in the longitudinal direction to close openings of the plurality of slit-shaped flow paths at the upstanding end in at least a front end portion of the heat dissipating portion. Note that the closing portion may be a single flat plate which extends so as to continue in the arrangement direction in the heat dissipating portion and which closes the openings of the slit-shaped flow paths at the upstanding end. Alternatively, the closing portion may be, e.g., a group of a plurality of small piece members separately closing the openings of the slit-shaped flow paths at the upstanding end.

The closing portion closing the openings of the slit-shaped flow paths at the upstanding end in the front end portion of the heat dissipating portion suppresses the decrease in airflow velocity in the slit-shaped flow path as air flows toward the rear end.

The following can be assumed as a reason why the function to suppress the decrease in airflow velocity is obtained by the closing portion. That is, an air passage area is significantly reduced by a thickness of the fins at a front end (i.e., an inlet end) of the heat dissipating portion, and therefore air which is about to flow into the slit-shaped flow path through the front end of the heat dissipating portion has a velocity component in a direction from the base end to the upstanding end of the fin, i.e., in a direction in which air is diverted from the heat dissipating portion (such air may be hereinafter referred to as "diverted air," and the direction from the base end to the upstanding end of the fin may be referred to as a "diverting direction."). Since the closing portion is attached so as to close the openings of the slit-shaped flow paths in the front end portion of the heat dissipating portion, the closing portion contacts the air having the velocity component in the diverting direction to change a flow direction thereof to a direction toward back along the closing portion. It is assumed that, by suppressing the diverted air and changing the flow direction thereof to the direction toward back in the front end portion of the heat dissipating portion, the decrease in airflow velocity in the slit-shaped flow path as air flows toward the rear end is suppressed.

Considering the contact of the closing portion with the diverted air, a configuration in which a flat plate-shaped protruding portion protruding from the front portions of the fins at the upstanding end toward front in the longitudinal direction is provided may be employed in addition to the foregoing configuration in which the closing portion extending from the front end of the heat dissipating portion toward back in the longitudinal direction closes the openings of the slit-shaped flow paths at the upstanding end.

That is, the rectifying portion may be a flat plate-shaped protruding portion provided so as to extend from the front portions of the plurality of fins at the upstanding end toward front in the longitudinal direction and protruding from front end edges of the plurality of fins toward front. As in the closing portion, the protruding portion provided in the front portions of the fins at the upstanding end suppresses the diverted air and changes the flow direction thereof to the direction toward back. Thus, the decrease in airflow velocity in the slit-shaped flow path is suppressed, and therefore such a configuration is advantageous to the improvement of the cooling efficiency of the heat sink.

The rectifying portion may be a flat plate-shaped rectifying portion which extends toward back and front with respect to a front end edge of the heat dissipating portion to close openings of the slit-shaped flow paths at the upstanding end in at least a front end portion of the heat dissipating portion, and which protrudes from front end edges of the plurality of fins toward front.

That is, the closing portion and the protruding portion may be integrated and attached to the front end of the heat dissipating portion. This significantly improves the function to suppress the decrease in airflow velocity in the slit-shaped flow path as compared to a case where only the closing portion or the protruding portion is provided.

The heat dissipating portion further includes a rectifying portion attached to a rear end side of the heat dissipating portion.

By attaching the rectifying portion to the rear end side of the heat dissipating portion, the airflow velocity in the slit-shaped flow path near the rear end portion of the heat dissipating portion is increased. The inventors of the present invention have found that the rectifying portion attached to the rear end side promotes a flow of air flowing into the slit-shaped flow path through the opening thereof at the upstanding end in a region from a middle portion to a rear end portion of the heat dissipating portion. It is appreciated that such an airflow is caused by a function to increase the airflow velocity in the slit-shaped flow path in the rear end portion of the heat dissipating portion. In the airflow in the slit-shaped flow path, a temperature is cumulatively increased as air flows toward a downstream side. Thus, if heat is uniformly generated from the heating element in the flow direction (i.e., the arrangement direction), a temperature of the heating element is maximum in the rear end portion of the heat dissipating portion. In such a case, the function to increase the airflow velocity in the rear end portion of the heat dissipating portion is extremely effective for suppressing the maximum temperature. Both of the function to suppress the decrease in airflow velocity by the rectifying portion at the front end and the function to increase the airflow velocity by the rectifying portion at the rear end are obtained by providing the rectifying portion at each of the front and rear ends of the heat dissipating portion. Thus, such a configuration is more advantageous to the improvement of the cooling efficiency of the heat sink.

The rectifying portion may be attached to each of a front end side and the rear end side of the heat dissipating portion so that the heat dissipating portion has a symmetrical shape in the longitudinal direction.

The symmetrical shape in the longitudinal direction is advantageous to application of the heat sink in a movable body, a traveling direction of which is switchable, such as track vehicles including a railway vehicle. That is, when the traveling direction of the movable body is a predetermined direction, the rectifying portion provided at the front end of the heat dissipating portion functions to suppress the decrease in airflow velocity, and the rectifying portion provided at the rear end of the heat dissipating portion functions to increase the airflow velocity. On the other hand, when the traveling direction of the movable body is a direction opposite to the predetermined direction, the front end portion of the heat dissipating portion in the preceding case is changed to the rear end portion, and the rear end portion of the heat dissipating portion in the preceding case is changed to the front end portion. However, the symmetrical shape in the longitudinal direction allows the rectifying portion in the front end portion in the traveling in the direction opposite to the predetermined direction to function to suppress the decrease in airflow velocity, and allows the rectifying portion in the rear end portion in the traveling in the direction opposite to the predetermined direction to function to increase the airflow velocity. As in the foregoing, in both of the case where the traveling direction of the movable body is the predetermined direction and the case where the traveling direction of the movable body is the direction opposite to the predetermined direction, both of the function to suppress the decrease in airflow velocity and the function to increase the airflow velocity can be similarly obtained.

The rectifying portion may extend to close the openings of the slit-shaped flow paths at the upstanding end across an entirety of the openings from the front ends to the rear ends of the plurality of fins.

When the openings of the slit-shaped flow paths at the upstanding end are closed across the entirety of the openings, each of the slit-shaped flow paths opens only at the front end and the rear end thereof (i.e., a closed path), and therefore there is no obstacle blocking the airflow in the slit-shaped flow path. If heat transfer in the slit-shaped flow path is not taken into consideration, the airflow path in the slit-shaped flow path is constant from an inlet to an outlet of the slit-shaped flow path. The entirely closed structure is the most effective for the function to suppress the decrease in airflow velocity in the slit-shaped flow path as compared to other structures, and therefore it is expected that such a structure is extremely advantageous to the improvement of the cooling efficiency. Meanwhile, the inventors of the present invention have found that efficiency in cooling the heating element is not always highest when the openings of the slit-shaped flow paths at the upstanding end are closed.

As described above, since the temperature of the airflow in the slit-shaped flow path is gradually increased from an inlet side (i.e., a front end) to an outlet side (i.e., a rear end) of the slit-shaped flow path, air density is decreased in association with the temperature elevation, and, on the other hand, air viscosity is increased. The decrease in air density (in other words, an increase in volume) results in an increase in volume flow rate (i.e., the airflow velocity), and the increase in air viscosity results in an increase in friction between air and the fin. Thus, resistance is increased as air flows toward the outlet side of the slit-shaped flow path. It is assumed that, because air does not flow in/out through the opening of the slit-shaped flow path at the upstanding end in the slit-shaped flow path opening only at the front and rear ends, a mass flow rate of air taken into the heat sink is decreased due to the increase in resistance on the outlet side, and therefore the cooling efficiency of the heat sink is degraded. Thus, it is better not to close the openings of the slit-shaped flow paths at the upstanding end across the entirety of the openings in the longitudinal direction, e.g., under a high thermal load under which an air temperature elevation rate from the inlet side to the outlet side of each of the slit-shaped flow paths is high. On the other hand, it is assumed that the closing of the openings of the slit-shaped flow path at the upstanding end across the entirety of the openings is advantageous to the cooling efficiency, e.g., when a thermal load is relatively low or an air velocity in a flow field is high.

Each of the plurality of fins may be formed in a trapezoidal shape in which the front end edge and the rear end edge of the each of the plurality of fins are inclined to the longitudinal direction.

As compared to a rectangular fin in which a front end edge and a rear end edge are perpendicular to the longitudinal direction, the airflow velocity in the slit-shaped flow path can be increased by the trapezoidal fin in which the front end edge and the rear end edge are inclined from the base end to the upstanding end so as to extend toward the middle of the fin in the longitudinal direction, or an inverted trapezoidal fin in which a front end edge and a rear end edge are inclined from the base end to the upstanding end so as to outwardly extend in the longitudinal direction. Thus, a configuration in which the trapezoidal fins are combined with the rectifying portion is more advantageous to the improvement of the cooling efficiency of the heat sink.

Each of the plurality of fins may be formed in a trapezoidal shape in which each of the front end edge and the rear end edge of the each of the plurality of fins is inclined from the base end to the upstanding end so as to extend toward the middle of the each of the plurality of fins in the longitudinal direction, and the each of the plurality of fins may be symmetric in the longitudinal direction.

As described above, the trapezoidal fin relatively increases the airflow velocity in the silt-shaped flow path. In addition, since a length of the trapezoidal fin in the longitudinal direction at the base end is relatively longer than that of the inverted trapezoidal fin (suppose that a length of the entire heat sink in the longitudinal direction is the same between the trapezoidal fin and the inverted trapezoidal fin), a degree of flexibility for arrangement of the heating element on the base is improved by the longer length in the heat sink with the trapezoidal fins. Further, the symmetrical fin shape in the longitudinal direction is advantageous when the traveling direction of the movable body is switched as described above.

Advantages of the Invention

As described above, since the decrease in the airflow velocity in the slit-shaped flow path as air flows toward the rear end can be suppressed in the heat sink disclosed herein, the heat sink is advantageous to the improvement of the cooling efficiency.

BRIEF DESCRIPTION OF THE DRAWINGS

FIG. 1 is a side view illustrating a heat sink for cooling power semiconductor devices, which is arranged under a floor of a railway vehicle.

FIG. 2 is a perspective view illustrating the heat sink with a top and a bottom thereof being inverted from an arrangement state.

FIG. 3 is a variation of the heat sink.

FIGS. 4(a)-4(e) are examples of the heat sink including rectangular fins.

FIGS. 5(a)-5(e) are examples of the heat sink including trapezoidal fins.

FIG. 6 is a velocity distribution plot corresponding to results of computational fluid dynamics performed for the example (first conventional example) of the heat sink including the rectangular fins.

FIG. 7 is an enlarged view near a front end portion of a heat dissipating portion in the velocity distribution plot of FIG. 6.

FIG. 8 is an enlarged view near a rear end portion of the heat dissipating portion in the velocity distribution plot of FIG. 6.

FIG. 9 is a velocity distribution plot corresponding to results of computational fluid dynamics performed for the example (first example) where closing portions and protruding portions are attached to the heat sink including the rectangular fins.

FIG. 10 is an enlarged view near a front end portion of a heat dissipating portion in the velocity distribution plot of FIG. 9.

FIG. 11 is an enlarged view near a rear end portion of the heat dissipating portion in the velocity distribution plot of FIG. 9.

FIG. 12 is a graph for comparing average velocities of examples, comparative examples, and a conventional example in each position of a YZ plane in a longitudinal direction in a slit-shaped flow path in association with a presence or absence of a closing portion and a protruding portion.

FIG. 13 is a graph for comparing average velocities of examples and conventional examples in each position of the YZ plane in the longitudinal direction in the slit-shaped flow path in association with a shape of the fin.

FIG. 14 is an enlarged view near a front end portion of a heat dissipating portion in a velocity distribution plot corresponding to results of computational fluid dynamics performed for the example (sixth example) where closing portions and protruding portions are attached to the heat sink including the trapezoidal fins.

FIG. 15 is an enlarged view near a rear end portion of the heat dissipating portion in the velocity distribution plot corresponding to the results of the computational fluid dynamics performed for the sixth example.

FIG. 16 is a velocity distribution plot corresponding to results of computational fluid dynamics performed for the example (fifth example) where closing portions provided for the rectangular fins close openings of slit-shaped flow paths at an upstanding end across an entirety of the openings in the longitudinal direction.

FIG. 17 is a graph for comparing average velocity of an example and a conventional example in each position of the YZ plane in the longitudinal direction in the slit-shaped flow path in association with an inverted trapezoidal fin.

FIG. 18 is a graph of measurement results of a cooling effect of various heat sinks, which were obtained by measuring a temperature of a simulated heating element attached to the heat sink.

DESCRIPTION OF EMBODIMENTS

Figure 1:
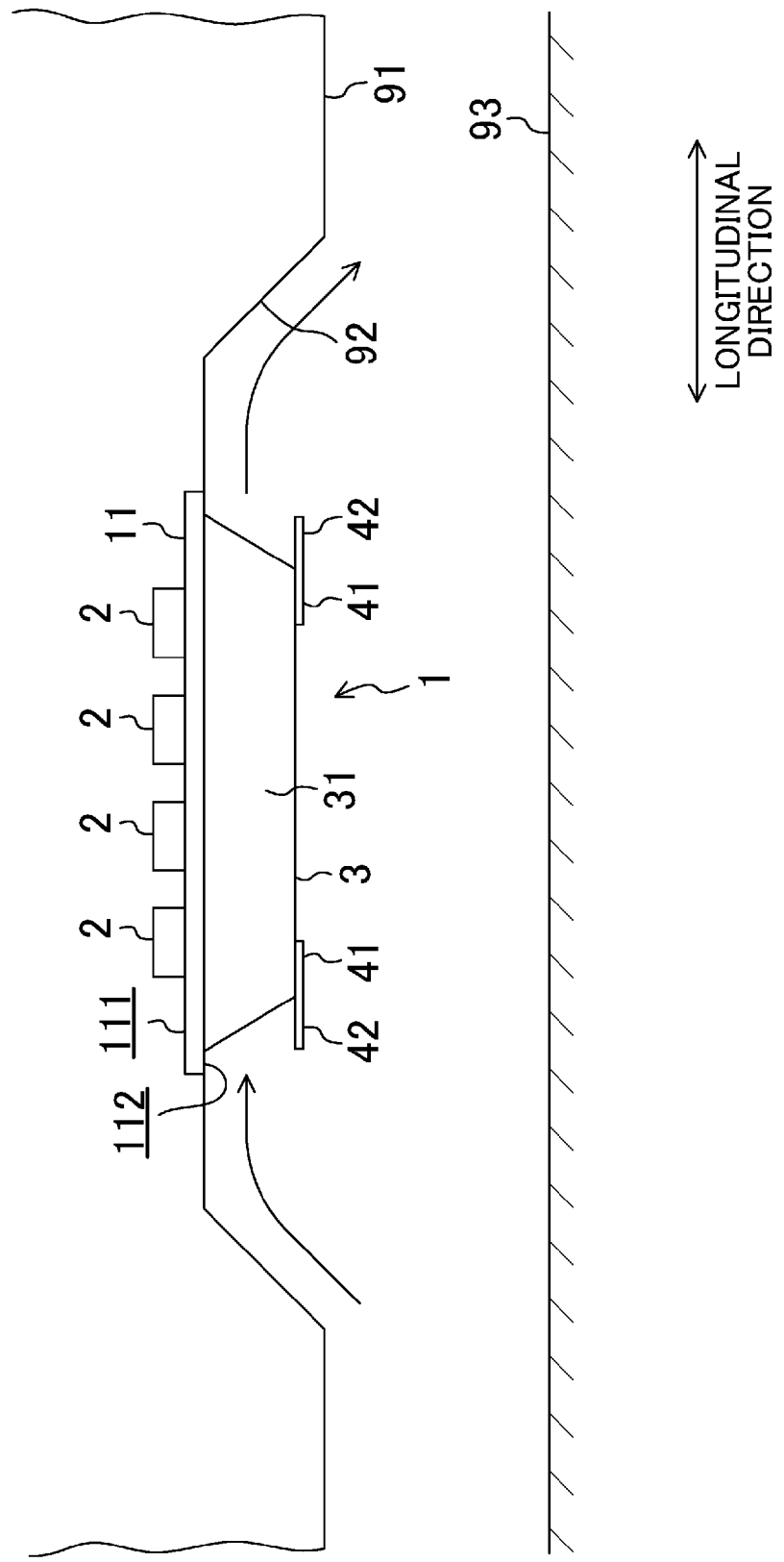
[FIG. 1]
Figure 2:
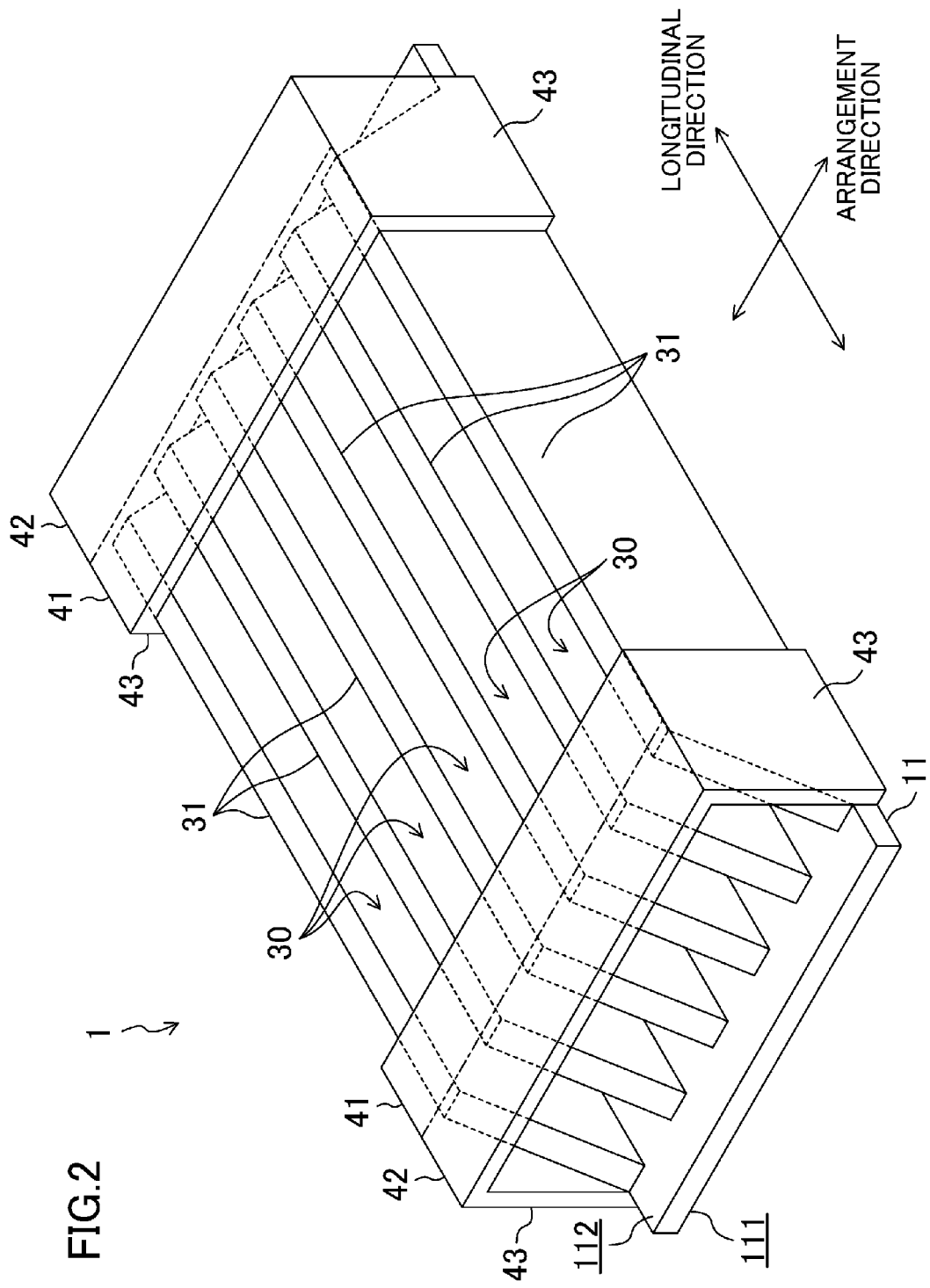
[FIG. 2]

An embodiment will be described below with reference to the drawings. Note that the embodiment will be set forth merely for purposes of preferred examples in nature, and is not intended to limit applications and use of the invention. FIG. 1 illustrates an example where a heat sink 1 is applied in a railway vehicle 91 which is a movable body, and FIG. 2 illustrates the heat sink 1 with a top and a bottom thereof being inverted. The heat sink 1 is a cooler for cooling power semiconductor devices 2 used for driving the railway vehicle 91, and the heat sink 1 is arranged in a recessed portion 92 formed under a floor of the railway vehicle 91. While the railway vehicle 91 travels along a rail 93 which is a track, the heat sink 1 is exposed to a traveling air stream flowing under the floor of the railway vehicle 91. In the present example, the railway vehicle 91 travels from right to left, thereby exposing the heat sink 1 to the traveling air stream flowing from left to right (see arrows in FIG. 1). The heat sink 1 dissipates heat of the power semiconductor devices 2 to cool the power semiconductor devices 2. Unlike forced air cooling which uses, e.g., a blower, the heat sink 1 cools the power semiconductor devices 2 by the traveling air stream as described above. This realizes simplification, weight reduction, and energy reduction of a cooling system, and, as a result, contributes to energy saving of the entire railway vehicle 91.

As illustrated in FIGS. 1 and 2, the heat sink 1 includes a base 11 to which the power semiconductor devices 2 are attached, and a heat dissipating portion 3 having a plurality of fins 31 each vertically arranged on the base 11.

The base 11 is a flat plate which extends in a longitudinal direction of the railway vehicle 91 and a direction perpendicular to the longitudinal direction (hereinafter referred to as an "arrangement direction") and which has a predetermined thickness. In the base 11, an attachment surface 111 (i.e., an upper surface as viewed in FIG. 1) to which the power semiconductor devices 2 are attached, and a heat dissipation surface 112 (i.e., a lower surface as viewed in FIG. 1) on which each of the fins 31 is vertically arranged are provided so as to face each other in a thickness direction of the base 11. In a state in which, e.g., grease having high heat conductivity is interposed between the power semiconductor device 2 and the attachment surface 111 of the base 11, the power semiconductor device 2 is attached so as to contact the attachment surface 111. Note that, although four power semiconductor devices 2 are arranged in the longitudinal direction in the present example, arrangement of the power semiconductor devices 2 is not limited, and the number of power semiconductor devices 2 is not also limited. However, in order to realize a consistent cooling effect regardless of directivity in a traveling direction of the railway vehicle 91, the power semiconductor devices 2 are preferably arranged so that heat is symmetrically distributed in the longitudinal direction.

Each of the fins 31 is a flat plate having a predetermined thickness. The fin 31 is vertically arranged on the heat dissipation surface 112 of the base 11 so as to extend from a base end (i.e., an upper end as viewed in FIG. 1) contacting the heat dissipation surface 112 from an upstanding end (i.e., a lower end as viewed in FIG. 1) in a direction perpendicular to the heat dissipation surface 112. In addition, the fin 31 is arranged so as to extend in the longitudinal direction. A front end edge (i.e., a left end edge as viewed in FIG. 1) and a rear end edge (i.e., a right end edge as viewed in FIG. 1) of the fin 31 are inclined from the base end to the upstanding end at the same angle so as to extend toward the middle of the fin 31 in the longitudinal direction. Thus, the fin 31 is formed in a trapezoidal shape (a so-called "inverted trapezoidal shape" in which an upper side of the fin 31 is longer than a lower side of the fin 31 in a state in which the fin 31 is attached to the vehicle illustrated in FIG. 1) which is symmetric in the longitudinal direction. Note that a shape of the fin 31 is not limited to the present example, and a height (i.e., a length from the base end to the upstanding end) of the fin 31 and a ratio of a length of the fin 31 in the longitudinal direction to a thickness of the fin 31 can be set as necessary. In addition, any angle may be employed as an inclination angle of the front end edge and the rear end edge.

The plurality of fins 31 are arranged on the heat dissipation surface 112 of the base 11 so as to be apart from each other at a predetermined interval in the arrangement direction. Although six fins 31 are arranged in the present example, the number of fins 31 of the heat dissipating portion 3 is not limited to the present example. In the heat dissipating portion 3, a slit-shaped flow path 30 extending in the longitudinal direction is defined between the adjacent fins 31. The slit-shaped flow path 30 opens at a front end (i.e., a left front end as viewed in FIG. 2), a rear end (i.e., a right rear end as viewed in FIG. 2), and the upstanding end (i.e., an upper end as viewed in FIG. 2) of the fin 31. Note that a width of the slit-shaped flow path 30 may be set to any width, and is not limited to the present example. Although not shown in the figure, a reinforcing member extending in the arrangement direction so as to connect the fins 31 together may be attached near the middle of the upstanding end of the fin 31 in the longitudinal direction in order to reinforce each of the fins 31. A plurality of reinforcing members may be attached so as to be spaced from each other in the longitudinal direction.

The heat sink 1 is made of material having high heat conductivity, such as aluminum. For the heat sink 1, the base 11 and the heat dissipating portion 3 may be integrally formed by, e.g., extrusion or die casting, or the fins 31 may be bonded to the base 11 by various suitable methods such as welding, brazing, and bonding with an adhesive.

A closing portion 41 and a protruding portion 42 which are provided as a rectifying portion are attached to each of a front end portion and a rear end portion of the heat dissipating portion 3 of the heat sink 1.

The closing portion 41 is a portion extending toward back/front from each of a front end and a rear end of the fin 31 at the upstanding end, and the closing portion 41 closes openings of the slit-shaped flow paths 30 at the upstanding end in each of the front end portion and the rear end portion of the heat dissipating portion 3. The closing portion 41 is a flat plate which extends in the arrangement direction in each of the front end portion and the rear end portion of the heat dissipating portion 3, and which is bonded to each of upstanding end surfaces of the fins 31. Note that any length may be employed as a length of the closing portion 41 in the longitudinal direction. A change in length of the closing portion 41 in the longitudinal direction results in a change in state of an airflow through each of the slit-shaped flow paths 30, thereby changing cooling efficiency of the heat sink 1.

The protruding portion 42 is a portion arranged so as to horizontally protrude from each of a front end edge and a rear end edge of the heat dissipating portion 3 toward back/front at a height corresponding to the upstanding end of the fin 31. The protruding portion 42 is a flat plate which is integrally formed with the flat plate-shaped closing portion 41 so as to continue from the closing portion 41. A boundary between the closing portion 41 and the protruding portion 42 is indicated by a phantom line in FIG. 2. In addition, any length may be employed as a length of the protruding portion 42 in the longitudinal direction. A change in length of the protruding portion 42 in the longitudinal direction results in a change in state of the airflow through each of the slit-shaped flow paths 30, thereby changing the cooling efficiency of the heat sink 1.

Reinforcing portions 43 are integrally formed with the integrated flat plate-shaped member of the closing portion 41 and the protruding portion 42 in both side end portions of the integrated flat plate-shaped member in an arrangement direction of the closing portion 41 and the protruding portion 42. Each of the reinforcing portions 43 is a plate which is bent along the integrated flat plate-shaped member of the closing portion 41 and the protruding portion 42, and extends toward the base 11. The closing portion 41, the protruding portion 42, and a pair of the reinforcing portions 43 define substantially a U-shape. Note that, for the sake of clarity of the description, the reinforcing portion 43 is not shown in FIG. 1, and only the closing portions 41 and the protruding portions 42 are illustrated in FIG. 1. The reinforcing portion 43 is for enhancing strength of the integrated flat plate-shaped member of the closing portion 41 and the protruding portion 42, and is also used for attaching the closing portion 41 and the protruding portion 42 to the heat dissipating portion 3 of the heat sink 1. That is, the closing portion 41 is bonded to the upstanding surfaces of the fins 31 by a suitable bonding method such as brazing, welding, and boding with an adhesive, whereas the reinforcing portions 43 are separately bonded to the fins 31 positioned on both sides in the arrangement direction and the base 11. Thus, the flat plate-shaped member formed by integrating the closing portion 41 and the protruding portion 42 can be stably attached to the heat sink 1 to be exposed to the traveling air stream. Note that the reinforcing portion 43 may be omitted. If the reinforcing portion 43 is omitted, it is desired that, e.g., a reinforcing rib is provided in the closing portion 41 and the protruding portion 42 in order to enhance the strength of the closing portion 41 and the protruding portion 42.

As described above, the heat sink 1 having the foregoing configuration is arranged in the recessed portion 92 formed under the floor of the railway vehicle 91, and, as illustrated in FIG. 1, is exposed to the traveling air stream flowing from left to right while the railway vehicle 91 travels from right to left. More specifically, the traveling air stream flowing from left to right flows into the slit-shaped flow paths 30 through the openings thereof at a front end (i.e., a left end as viewed in FIG. 1) of the heat dissipating portion 3 of the heat sink 1, and flows out from the slit-shaped flow paths 30 through the openings thereof at a rear end (i.e., a right end as viewed in FIG. 1) of the heat dissipating portion 3. In each of the slit-shaped flow paths 30, heat of the power semiconductor devices 2 is dissipated by heat transfer through surfaces of the fins 31. In such a manner, the power semiconductor devices 2 are cooled.

Although will be described later, the closing portion 41 and the protruding portion 42 arranged in the front end portion of the heat dissipating portion 3 have a function to suppress a decrease in velocity of an airflow in the slit-shaped flow path 30 as air flows toward a rear end of the slit-shaped flow path 30. On the other hand, although will be described later, the closing portion 41 and the protruding portion 42 arranged in the rear end portion of the heat dissipating portion 3 have a function to increase the velocity of the airflow in the slit-shaped flow path 30 on a side closer to the rear end of the slit-shaped flow path 30. Thus, in the heat sink 1 having the foregoing configuration, the suppression of the decrease in velocity of the airflow in the slit-shaped flow path 30 and the increase in airflow velocity on the side closer to the rear end of the heat dissipating portion 3 are combined, thereby efficiently cooling the power semiconductor devices 2 arranged in the longitudinal direction. That is, the cooling efficiency of the heat sink 1 is improved.

As compared to a rectangular fin 31, a front end edge and a rear end edge of which are perpendicular to the heat dissipation surface 112, the heat dissipating portion 3 including the trapezoidal fins 31 has a function to increase the velocity of the airflow in the slit-shaped flow path 30. By combining such a function with the function to suppress the decrease in airflow velocity and the function to increase the airflow velocity, the power semiconductor devices 2 can be more efficiently cooled, and therefore the cooling efficiency of the heat sink 1 can be further improved. In order to realize thermal uniformity of the plurality of power semiconductor devices 2 arranged in the longitudinal direction and efficiently cool the power semiconductor devices 2, heat pipes extending in the longitudinal direction may be embedded in the base 11.

Further, a configuration of the heat sink 1, which includes the shape of the fin 31 and a configuration of the closing portion 41 and the protruding portion 42 is symmetric in the longitudinal direction. Thus, the consistent cooling efficiency of the heat sink 1 can be obtained regardless of the traveling direction. Consequently, the foregoing configuration is advantageous to the railway vehicle 91, the traveling direction there is switchable.

(Variations)

FIGS. 3(a)-3(d) mainly illustrate variations of the closing portion 41 and the protruding portion 42. First, in FIG. 3(a), the protruding portions 42 are omitted in the front end portion and the rear end portion of the heat dissipating portion 3, and only the closing portions 41 closing the openings of the slit-shaped flow paths 30 at the upstanding end are provided. In an example where only the closing portion 41 is provided in the front end portion of the heat dissipating portion 3, the function to suppress the decrease in velocity of the airflow in the slit-shaped flow path 30 can be obtained. However, as compared to the example (see FIG. 1) where the closing portions 41 and the protruding portions 42 are provided, it is more effective for the function to suppress the decrease in airflow velocity in the example where the closing portions 41 and the protruding portions 42 are provided.

Figure 3:
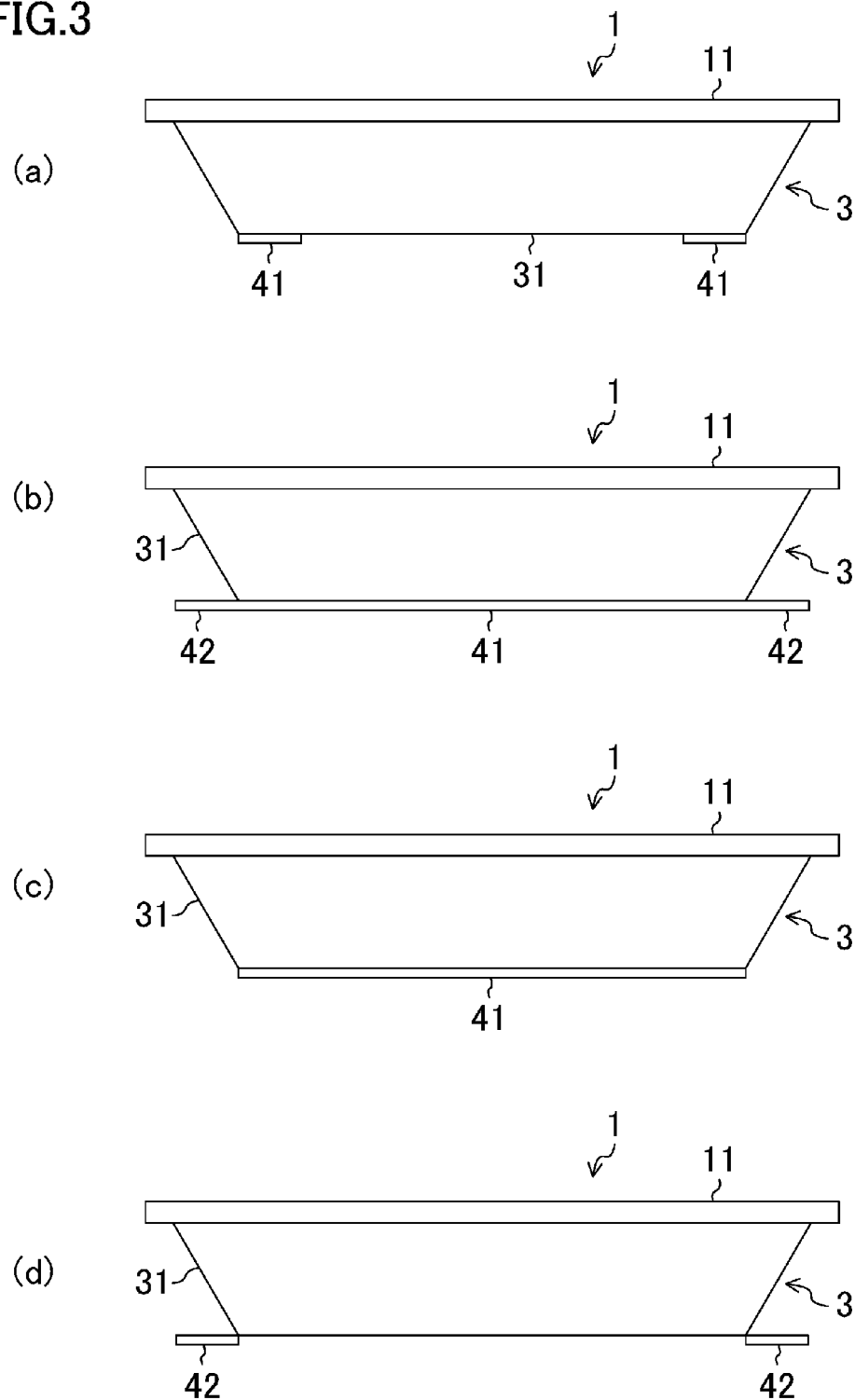
[FIG. 3]

In FIG. 3(b), the closing portions 41 provided in the front end portion and the rear end portion of the heat dissipating portion 3 extend toward the middle of the heat sink 1 in the longitudinal direction, and, as a result, close the openings of the slit-shaped flow paths 30 at the upstanding end across an entirety of the openings in the longitudinal direction. In this example, air does not flows in/out through the openings of the slit-shaped flow paths 30 at the upstanding end. Thus, air flows out through the opening at the rear end of the slit-shaped flow path 30 in a state in which the velocity when air flows into the slit-shaped flow path 30 is maintained. Consequently, the entirely closed structure is the most effective for the function to suppress the decrease in airflow velocity. However, considering the heat transfer in the slit-shaped flow path 30, an air temperature is increased as air flows toward an outlet, and therefore resistance to the airflow is increased on a side closer to the outlet due to a change in air property value in association with the increase in temperature. For the foregoing reason, it is assumed that, in a configuration in which the openings of the slit-shaped flow paths 30 at the upstanding end are closed across the entirety of the openings in the longitudinal direction, a mass flow rate of air flowing into the slit-shaped flow path 30 through the opening at the front end thereof is decreased, and the efficiency in cooling the power semiconductor devices 2 is degraded. Thus, the configuration of this example may be employed, e.g., when a thermal load is relatively low or an air velocity in a flow field around a heat sink is high. Note that an extension length of the closing portion 41 toward the middle of the heat sink 1 may be changed as necessary to provide the openings of the slit-shaped flow paths 30 at the upstanding end. In addition, the closing portion 41 does not close the openings of the slit-shaped flow paths 30 at the upstanding end across the entirety of the openings in the longitudinal direction as illustrated in FIG. 3(b), but at least three closing portions 41 may be provided to separately close the front end portion, the rear end portion, and a middle portion of the heat dissipating portion 3 in order to obtain a rectifying effect by the closing portions 41. Note that, as compared to the example illustrated in FIG. 3(b), the protruding portion 42 is omitted in an example illustrated in FIG. 3(c).

In an example illustrated in FIG. 3(d), the closing portion 41 is omitted, and only the flat plate-shaped protruding portions 42 are provided, which protrude from the upstanding end of the fin 31, i.e., the front end edge and the rear end edge of the heat dissipating portion 3 toward back and front in the longitudinal direction. In an example where only the protruding portion 42 is provided in the front end portion of the heat dissipating portion 3, the function to suppress the decrease in velocity of the airflow in the slit-shaped flow path 30 can be also obtained. However, as compared to the example (see FIG. 1) where the closing portions 41 and the protruding portions 42 are provided, it is more effective for the function to suppress the decrease in airflow velocity in the example where both of the closing portion 41 and the protruding portion 42 are provided.

FIGS. 4(a)-4(e) illustrate examples where the shape of the fin in the heat dissipating portion 3 is changed. In these examples, the heat dissipating portion 3 does not include the trapezoidal fins 31 but rectangular fins 32 in which a front end edge and a rear end edge thereof are perpendicular to the heat dissipation surface 112. In the example illustrated in FIG. 4(a), the closing portion 41 and the protruding portion 42 are provided in each of the front end portion and the rear end portion of the heat dissipating portion 3 including the rectangular fins 32. In the example illustrated in FIG. 4(b), only the closing portion 41 is provided in each of the front end portion and the rear end portion of the heat dissipating portion 3. Further, in the example illustrated in FIG. 4(c), the closing portions 41 in the front end portion and the rear end portion of the heat dissipating portion 3 extend in the longitudinal direction, and close the openings of the slit-shaped flow paths 30 at the upstanding end across the entirety of the openings in the longitudinal direction. In the example illustrated in FIG. 4(d), the protruding portions 42 are omitted from the example illustrated in FIG. 4(c). In the example illustrated in FIG. 4(e), only the protruding portion 42 is provided in each of the front end portion and the rear end portion of the heat dissipating portion 3.

Figure 4:
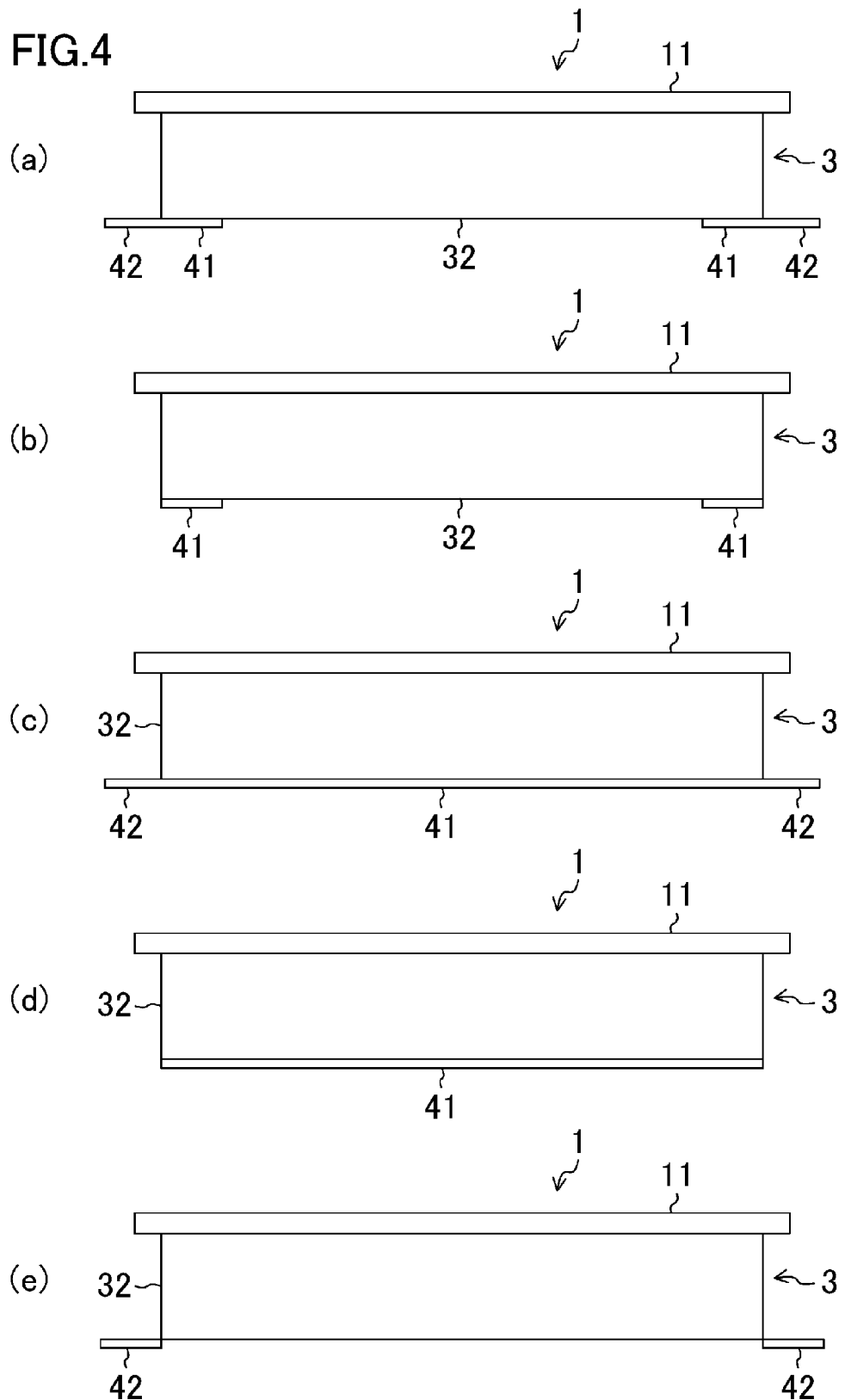
[FIG. 4]
Figure 5:
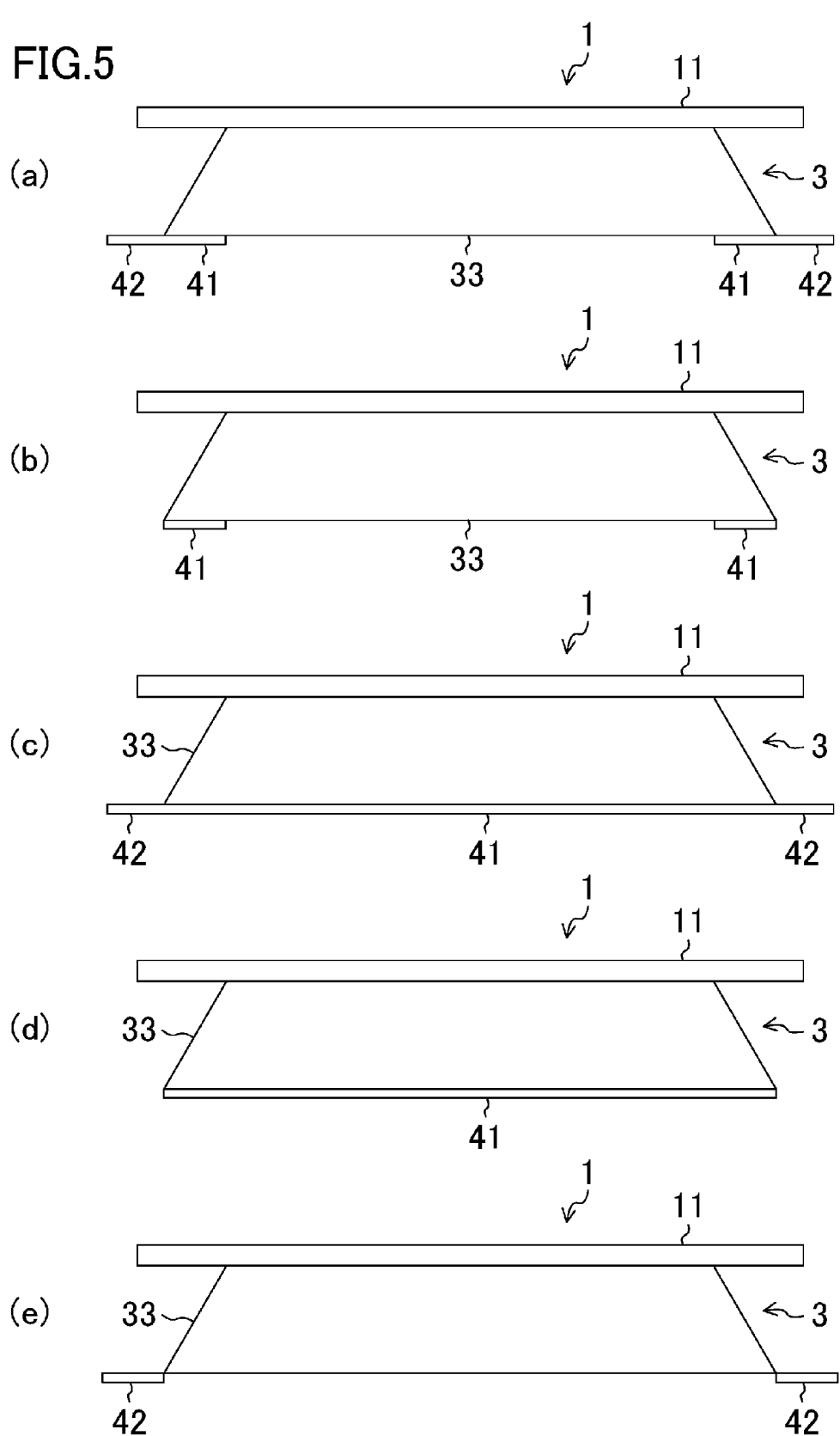
[FIG. 5]

If the fin 32 of the heat dissipating portion 3 is in the rectangular shape, the velocity of the airflow in the slit-shaped flow path 30 is reduced as compared to the trapezoidal fin 31. When comparing the examples illustrated in FIGS. 4(a)-4(e), the example illustrated in FIG. 4(a) is most advantageous in the cooling efficiency of the heat sink 1 because both of the function to suppress the decrease in airflow velocity and the function to increase the airflow velocity can be obtained. As compared to the example illustrated in FIG. 4(a), it is less effective for the function to suppress the decrease in airflow velocity in the example illustrated in FIG. 4(b). In addition, as compared to the example illustrated in FIG. 4(b), it is less effective for the function to suppress the decrease in airflow velocity in the example illustrated in FIG. 4(e). Further, as described above, in each of the examples illustrated in FIGS. 4(c) and 4(d), it is most effective for the function to suppress the decrease in airflow velocity if the heat transfer in the slit-shaped flow path 30 is not taken into consideration. However, the cooling efficiency in the examples of FIGS. 4(c) and 4(d) may be degraded as compared to the example illustrated in FIG. 4(a).

FIGS. 5(a)-5(e) illustrate examples where a fin 33 of the heat dissipating portion 3 is in an inverted trapezoidal shape. That is, in each of these examples, a front end edge and a rear end edge of the fin 33 are inclined from a base end to an upstanding end of the fin 33 (i.e., from top to bottom as viewed in FIG. 5) at the same angle so as to outwardly extend in the longitudinal direction. Thus, the fin 33 is formed in the inverted trapezoidal shape (a so-called "trapezoidal shape" in which an upper side of the fin 33 is shorter than a lower side of the fin 33 in a state in which the fin 33 is attached to the railway vehicle 91 as illustrated in FIG. 5) which is symmetric in the longitudinal direction. The examples illustrated in FIGS. 5(a)-5(e) correspond to the examples illustrated in FIGS. 4(a)-4(e). Specifically, the closing portion 41 and the protruding portion 42 are provided in each of the front end portion and the rear end portion of the heat dissipating portion 3 including the inverted trapezoidal fins 33 in the example illustrated in FIG. 5(a). In the example illustrated in FIG. 5(b), only the closing portion 41 is provided in each of the front end portion and the rear end portion of the heat dissipating portion 3. In the example illustrated in FIG. 5(c), the closing portions 41 in the front end portion and the rear end portion of the heat dissipating portion 3 extend in the longitudinal direction, and close the openings of the slit-shaped flow paths 30 at the upstanding end across the entirety of the openings in the longitudinal direction. In the example illustrated in FIG. 5(d), the protruding portions 42 are omitted from the example illustrated in FIG. 5(c). In the example illustrated in FIG. 5(e), only the protruding portion 42 is provided in each of the front end portion and the rear end portion of the heat dissipating portion 3.

As in the trapezoidal fin 31, if the fin 33 of the heat dissipating portion 3 is in the inverted trapezoidal shape, the fin 33 has the function to increase the velocity of the airflow in the slit-shaped flow path 30 as compared to the rectangular fin 32. Since comparison among the examples illustrated in FIG. 5(a)-5(e) are the same as that among the examples illustrated in FIGS. 4(a)-4(e), the description thereof is not repeated. There is almost no difference in a cooling function between the example where the fin of the heat dissipating portion 3 is in the inverted trapezoidal shape and the example where the fin of the heat dissipating portion 3 is in the trapezoidal shape. However, suppose that a length of the heat dissipating portion 3 of the inverted trapezoidal fin 33 in the longitudinal direction is the same as that of the trapezoidal fin 31. In such a state, since the length of the heat dissipating portion 3 of the inverted trapezoidal fin 33 in the longitudinal direction at the base end is shorter than that of the trapezoidal fin 31, there is a disadvantage that a degree of flexibility when the power semiconductor devices 2 are arranged in the longitudinal direction is reduced.

Note that, e.g., the flat plate-shaped protruding portion 42 may be arranged as follows instead of the protruding portion 42 arranged so as to extend in the horizontal direction. That is, the protruding portion 42 to be attached to the front end portion of the heat dissipating portion 3 may be arranged so as to be downwardly inclined toward front in the longitudinal direction, whereas the protruding portion 42 to be attached to the rear end portion of the heat dissipating portion 3 may be arranged so as to be downwardly inclined toward back in the longitudinal direction. In such a manner, the function to suppress the decrease in velocity of the airflow through the slit-shaped flow path and the function to increase the airflow velocity in the rear end portion of the heat dissipating portion can be obtained. However, in such a case, an upper surface of the inclined protruding portion 42 receives the traveling air stream. Thus, resistance is increased, and this may be disadvantageous in, e.g., attachment strength of the protruding portion 42 and generation of self-excited vibration. If the flat plate-shaped protruding portion 42 is arranged so as to extend in the horizontal direction as described above, the foregoing disadvantage is not caused, and the function to suppress the decrease in velocity of the airflow through the slit-shaped flow path and the function to increase the airflow velocity in the rear end portion of the heat dissipating portion can be sufficiently obtained.

The closing portion 41 is not necessarily a single plate extending in an arrangement direction in the heat dissipating portion 3, and may be a small piece separately closing the openings of the slit-shaped flow paths arranged in the arrangement direction in the heat dissipating portion 3, at the upstanding end. Note that the plate-shaped closing portion 41 as illustrated in, e.g., FIG. 2 is formed to have a "bonding overlap" at the upstanding end of the fin 31, and therefore such a configuration is advantageous in attachment of the closing portion 41.

In each of the foregoing examples, the shapes of all of the fins 31 provided in the heat dissipating portion 3 are the same, but the fins 31 having different shapes may be combined.

The heat sink 1 disclosed herein may be applied in, e.g., a vehicle which travels along a track and a traveling direction of which is switchable, such as a monorail vehicle and a tram. In addition, the heat sink 1 may be applied in, e.g., an electrical vehicle which travels by using power from a mounted battery, such as a passenger vehicle, a bus, and a truck. A traveling direction of the electrical vehicle is not switchable, and a direction of forward movement and a direction of backward movement are different from each other. Thus, a shape of the electrical vehicle is not necessarily symmetric in the longitudinal direction. For example, considering the cooling efficiency of the heat sink 1 when the electrical vehicle travels forward, a shape which is asymmetric in the longitudinal direction may be employed as necessary.

EXAMPLES

Figure 6:
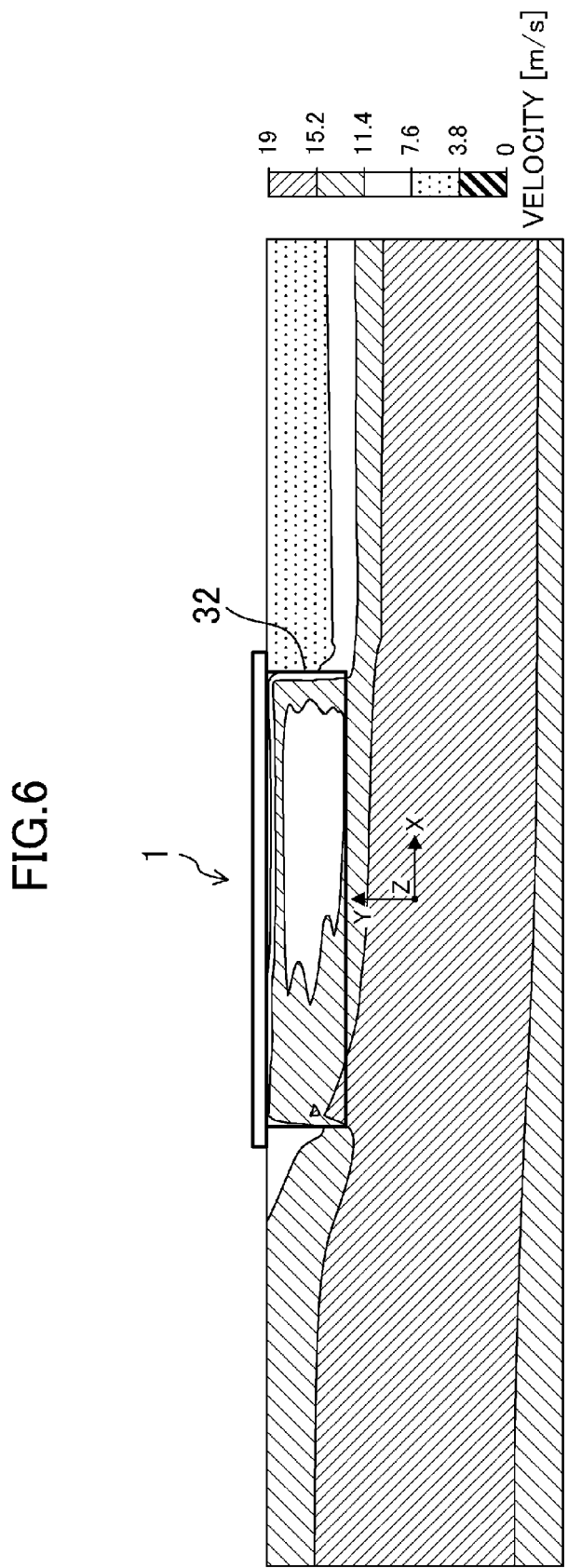
[FIG. 6]

Next, examples actually implemented in association with the technique of the present invention will be described with reference to the drawings. First, analytical results of a flow field in various types of a heat sink 1 by using computational fluid dynamics will be described. FIG. 6 illustrates results when three-dimensional computational fluid dynamics was performed for a flow field in which a simulated heat sink 1 is arranged in an upper wall of a wind tunnel under a predetermined airflow velocity, in order to simulate a heat sink which is arranged under a floor of a railway vehicle and is to be exposed to a traveling air stream. In the heat sink 1 of each of the examples described below, a length of a fin in the longitudinal direction is set to 690 mm, and a height of the fin is set to 120 mm. In addition, the airflow velocity in the wind tunnel is set to 15 m/s.

Figure 7:
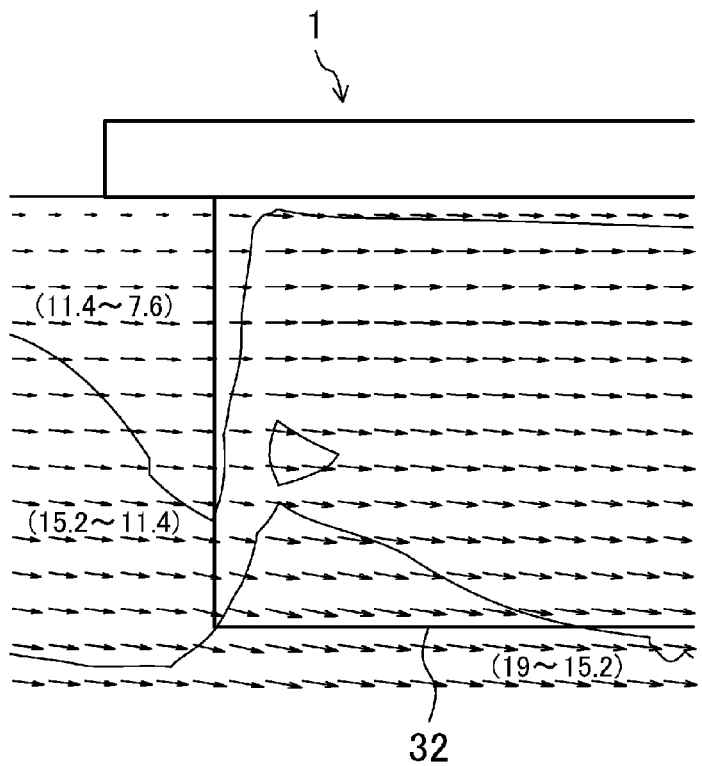
[FIG. 7]
Figure 8:
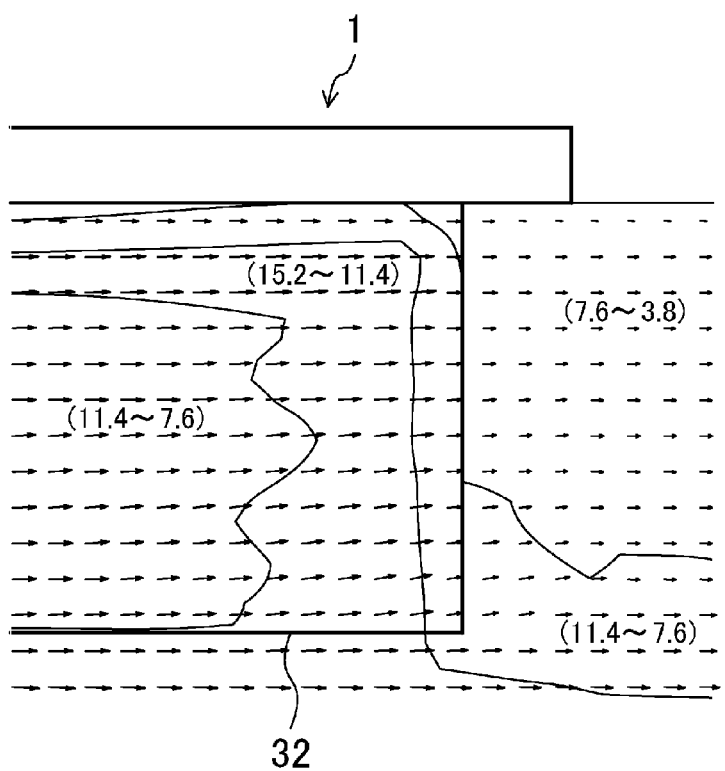
[FIG. 8]

FIGS. 6-8 illustrate results of the computational fluid dynamics in an example of the heat sink 1 including rectangular fins 31 as a first conventional example, and a closing portion 41 and a protruding portion 42 are not provided in this example. Specifically, FIG. 6 is a contour plot of an airflow velocity at each lattice point in a predetermined cross section (specifically a cross section in a slit-shaped flow path) in a Z direction (i.e., in a direction perpendicular to the plane of paper). FIG. 7 is a velocity vector distribution diagram illustrated with an enlarged view near a front end portion of a heat dissipating portion 3 (i.e., a left end portion of a rectangular fin 32 as viewed in FIG. 6). FIG. 8 is a velocity vector distribution diagram illustrated with an enlarged view near a rear end portion of the heat dissipating portion 3 (i.e., a right end portion of the rectangular fin 32 as viewed in FIG. 6). Note that numbers (e.g., "11.4-7.6" etc.) in FIGS. 7 and 8 indicate airflow velocity ranges in the contour regions, and such numbers correspond to numbers of explanatory legends in FIG. 6.

Figure 9:
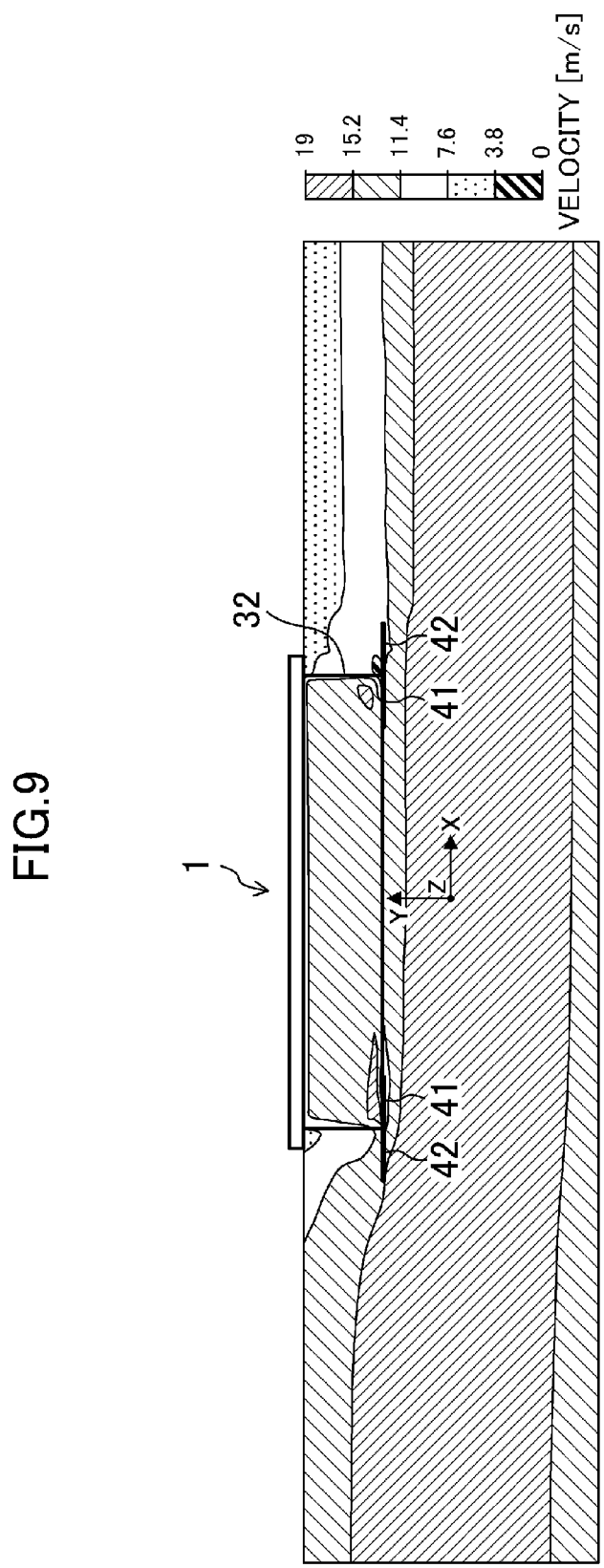
[FIG. 9]
Figure 10:
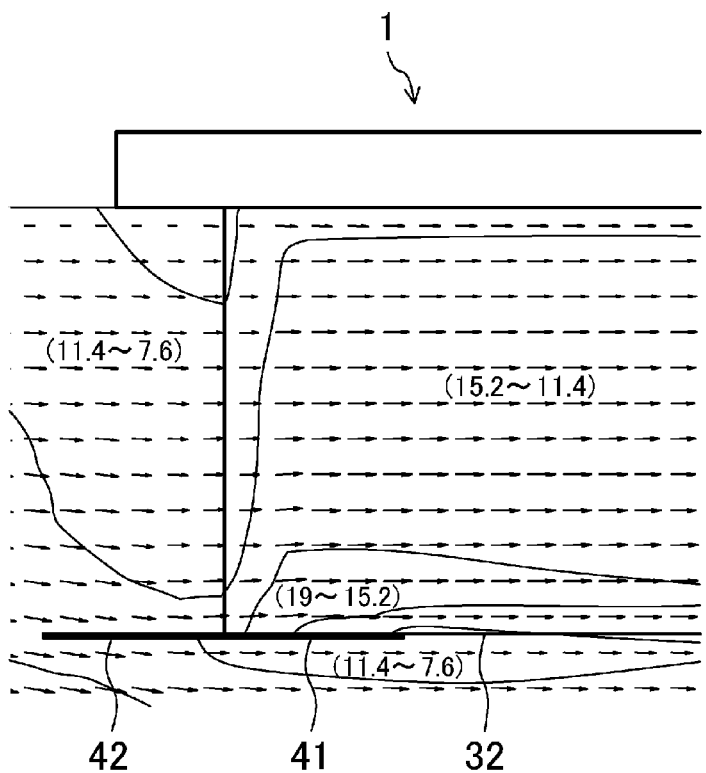
[FIG. 10]
Figure 11:
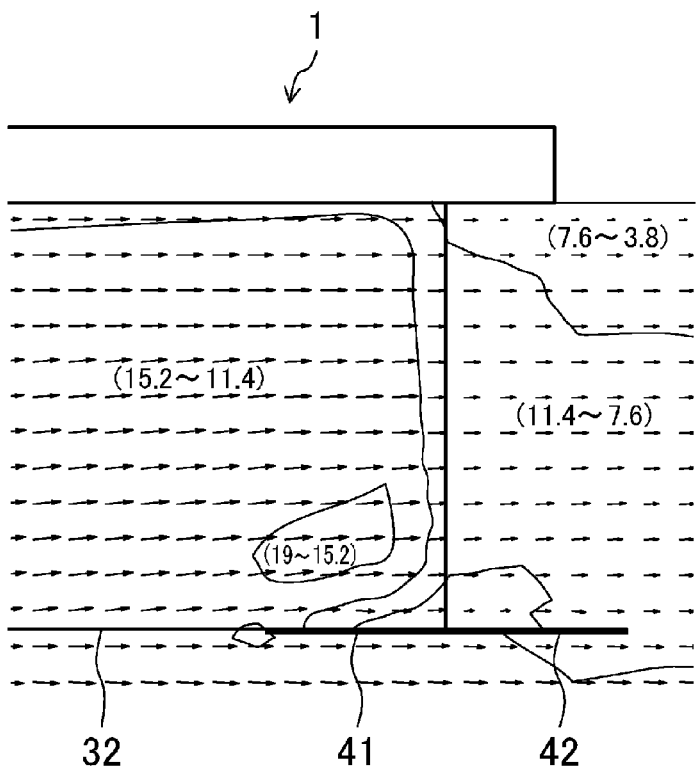
[FIG. 11]

On the other hand, FIGS. 9-11 illustrate results of the computational fluid dynamics in an example where a closing portion 41 and a protruding portion 42 are attached to each of a front end portion and a rear end portion of a heat dissipating portion 3 of a heat sink 1 including rectangular fins 32 as a first example. As in the foregoing, FIG. 9 is a contour plot of an airflow velocity at each lattice point in an XY cross section in a slit-shaped flow path. FIG. 10 is a velocity vector distribution diagram illustrated with an enlarged view near the front end portion of the heat dissipating portion 3 (i.e., a left end portion of the rectangular fin 32 as viewed in FIG. 9). FIG. 11 is a velocity vector distribution diagram illustrated with an enlarged view near the rear end portion of the heat dissipating portion 3 (i.e., a right end portion of the rectangular fin 32 as viewed in FIG. 9).

First, when comparing the examples illustrated in FIGS. 6 and 9, the first conventional example shows that a region where the airflow velocity is decreased (e.g., a blank region where the airflow velocity is 11.4-7.6 m/s in FIG. 6) is appeared from a middle portion to a rear end portion of the slit-shaped flow path 30 in the longitudinal direction (i.e., an X direction). On the other hand, in the first example, the region where the airflow velocity is decreased is not appeared, and therefore a decrease in airflow velocity is suppressed.

In addition, comparison was made between the examples illustrated in FIGS. 7 and 10 to compare the flow fields of the first example and the first conventional example in the front end portion of the heat dissipating portion 3. The first conventional example where the closing portion 41 and the protruding portion 42 are not provided shows that velocity vectors slightly point downward (in other words, velocity vectors point in a direction from a base end to an upstanding end of the fin 32) near the front end portion of the heat dissipating portion 3, particularly near the upstanding end (i.e., a lower end as viewed in FIG. 7). This is because an air passage area is significantly reduced by a thickness of the fins 32 at a front end (i.e., an inlet end) of the heat dissipating portion 3, and therefore air which is about to flow into the slit-shaped flow path 30 through the front end of the heat dissipating portion 3 flows so as to be diverted from the heat dissipating portion 3. On the other hand, in the first example where the closing portions 41 and the protruding portions 42 are provided, the diverted air contacts the closing portion 41 and the protruding portion 42 near the front end portion of the heat dissipating portion 3, thereby changing a flow direction to a horizontal direction along the closing portion 41 and the protruding portion 42. Thus, a region where the airflow velocity is high (e.g., a region where the airflow velocity is 19-15.2 m/s) is formed so as to extend toward a rear end of the slit-shaped flow path 30. As a result, it can be appreciated that the appearance of the region where the airflow velocity is decreased in the slit-shaped flow path 30 is caused due to a presence or absence of the closing portion 41 and the protruding portion 42 in the front end portion of the heat dissipating portion 3.

Further, comparison was made between the examples illustrated in FIGS. 8 and 11 to compare the flow fields of the first example and the first conventional example in the rear end portion of the heat dissipating portion 3. As compared to the first conventional example where the closing portion 41 and the protruding portion 42 are not provided, the first example where the closing portions 41 and the protruding portions 42 are provided shows that velocity vectors slightly point upward near the rear end portion of the heat dissipating portion 3, particularly near a front end edge of the closing portion 41, and a region which is not appeared in the first conventional example and in which the airflow velocity is high (e.g., a region where the airflow velocity is 19-15.2 m/s) is appeared near the rear end portion of the heat dissipating portion 3. This is because a flow of air flowing into the slit-shaped flow paths 30 through openings thereof at the upstanding end is generated by the closing portion 41 and the protruding portion 42, and such an airflow forms the region where the airflow velocity is high near the rear end portion of the heat dissipating portion 3 in the first example.

Figure 12:
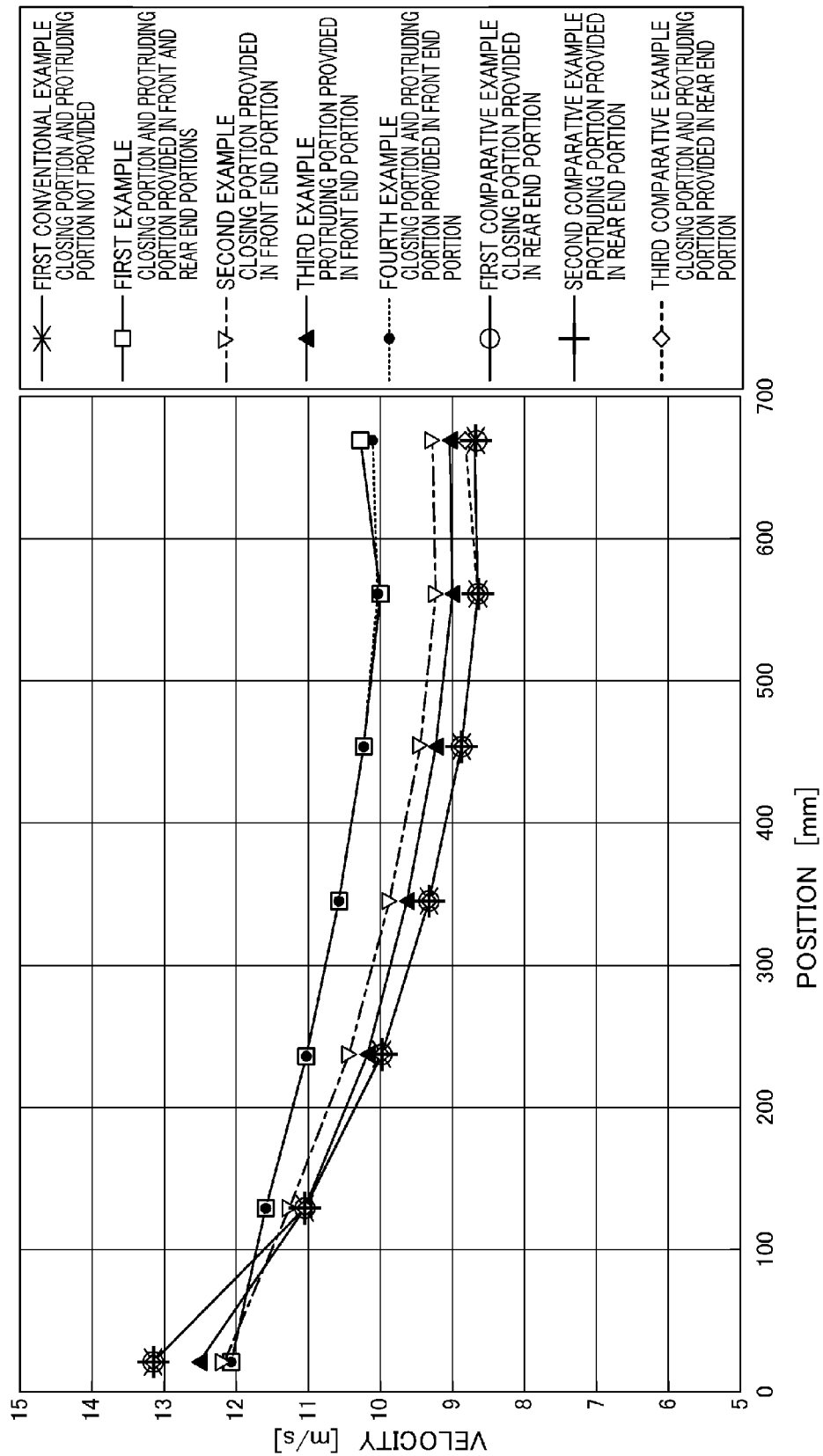
[FIG. 12]

Next, FIG. 12 is a graph for comparing average airflow velocities in a YZ plane in the slit-shaped flow path, which were calculated for examples including the first example and the first conventional example based on the results of the computational fluid dynamics. A horizontal axis of the graph represents a position in the YZ plane (a position indicated by 0 mm corresponds to a front end of the rectangular fin 32, and a position indicated by 690 mm corresponds to a rear end of the rectangular fin 32), and a vertical axis of the graph represents an average velocity (m/s). In addition to the first conventional example (see FIG. 6) where the closing portion 41 and the protruding portion 42 are not provided for the rectangular fins 32, and the first example (see FIG. 9) where the closing portion 41 and the protruding portion 42 are provided in each of the front end portion and the rear end portion of the heat dissipating portion including the rectangular fins 32, the followings are compared to each other in this graph although not shown in the figures: an example (second example) where only a closing portion 41 is provided in a front end portion of a heat dissipating portion including rectangular fins 32; an example (third example) where only a protruding portion 42 is provided in a front end portion of a heat dissipating portion including rectangular fins 32; an example (fourth example) where a closing portion 41 and a protruding portion 42 are provided in a front end portion of a heat dissipating portion including rectangular fins 32; an example (first comparative example) where only a closing portion 41 is provided in a rear end portion of a heat dissipating portion including rectangular fins 32; an example (second comparative example) where only a protruding portion 42 is provided in a rear end portion of a heat dissipating portion including rectangular fins 32; and an example (third comparative example) where a closing portion 41 and a protruding portion 42 are provided in a rear end portion of a heat dissipating portion including rectangular fins 32.

According to FIG. 12, in the first conventional example where the closing portion 41 and the protruding portion 42 are not provided, the average airflow velocity is relatively high (e.g., a little more than 13 m/s) in the front end portion of the heat dissipating portion. However, a degree of decrease in airflow velocity is increased as air flows toward the rear end portion of the heat dissipating portion, and the average airflow velocity is decreased to about 8.5 m/s in the rear end portion of the heat dissipating portion. This is consistent with the results of the computational fluid dynamics of FIG. 6, which show that the region where the airflow velocity is low is appeared from the middle portion to the rear end portion of the slit-shaped flow path 30.

In the second, third, first, and fourth examples each corresponding to the example where the closing portion 41, the protruding portion 42, or both of the closing portion 41 and the protruding portion 42 is/are provided in the front end portion of the heat dissipating portion, the average airflow velocity in the front end portion of the heat dissipating portion is relatively low (e.g., a little more than 12 m/s in the fourth example). However, the degree of decrease in airflow velocity is decreased as air flows toward the rear end portion of the heat dissipating portion 3, and the relatively-high average airflow velocity (e.g., a little more than 10 m/s in the fourth example) is maintained in the rear end portion of the heat dissipating portion 3. Further analysis shows that, when comparing the second example where only the closing portion 41 is provided and the third example where only the protruding portion 42 is provided, the degree of decrease in airflow velocity is lower in the second example, and therefore it is more effective for a function to suppress a decrease in airflow velocity in the second example. In addition, when comparing the second example, the third example, and the fourth example where the closing portion 41 and the protruding portion 42 are provided, the degree of decrease in airflow velocity is the lowest in the fourth example, and therefore it is the most effective for the function to suppress the decrease in airflow velocity in the fourth example. It is much more effective for the function to suppress the decrease in airflow velocity in the fourth example as compared to a case where the functions to suppress the decrease in airflow velocity in the second and third examples are simply combined together.

Next, the first, second, and third comparative examples were analyzed, each of which corresponds to the example where the closing portion 41, the protruding portion 42, or both of the closing portion 41 and the protruding portion 42 is/are provided in the rear end portion of the heat dissipating portion. In the first, second, and third comparative examples, the degree of decrease in airflow velocity is substantially the same as that of the conventional example, and the function to suppress the decrease in airflow velocity is hardly obtained. However, in the third example where both of the closing portion 41 and the protruding portion 42 are provided in the rear end portion of the heat dissipating portion 3, the average airflow velocity is increased in the rear end portion of the heat dissipating portion 3. Such a function to increase the airflow velocity can be also obtained in the first example where both of the closing portion 41 and the protruding portion 42 are provided in each of the front end portion and the rear end portion of the heat dissipating portion 3. That is, when comparing the first and fourth examples, the average airflow velocity in the rear end portion of the heat dissipating portion 3 is higher in the first example than in the fourth example.

According to the foregoing analytical results, at least one of the closing portion 41 or the protruding portion 42 is provided in the front end portion of the heat dissipating portion 3, thereby obtaining the function to suppress the decrease in airflow velocity in the slit-shaped flow path 30. When comparing the closing portion 41 and the protruding portion 42, it is more effective for the function to suppress the decrease in airflow velocity in the case where the closing portion 41 is provided. When both of the closing portion 41 and the protruding portion 42 are provided, it is the most effective for the function to suppress the decrease in airflow velocity because of a synergistic effect. In addition, the closing portion 41 and the protruding portion 42 are provided in the rear end portion of the heat dissipating portion 3, thereby obtaining the function to increase the airflow velocity in the rear end portion of the heat dissipating portion 3. Further, the closing portion 41 and the protruding portion 42 are provided in each of the front end portion and the rear end portion of the heat dissipating portion 3, thereby obtaining both of the function to suppress the decrease in airflow velocity and the function to increase the airflow velocity. Thus, such a configuration is most effective for suppressing the decrease in airflow velocity. Particularly in the airflow in the slit-shaped flow path 30, a temperature is cumulatively increased as air flows toward a downstream side. Thus, if heat is uniformly generated from a heating element in a flow direction, the temperature is maximum in the rear end portion of the heat dissipating portion 3. In such a case, the function to increase the airflow velocity in the rear end portion of the heat dissipating portion 3 is extremely effective for suppressing the maximum temperature.

Figure 13:
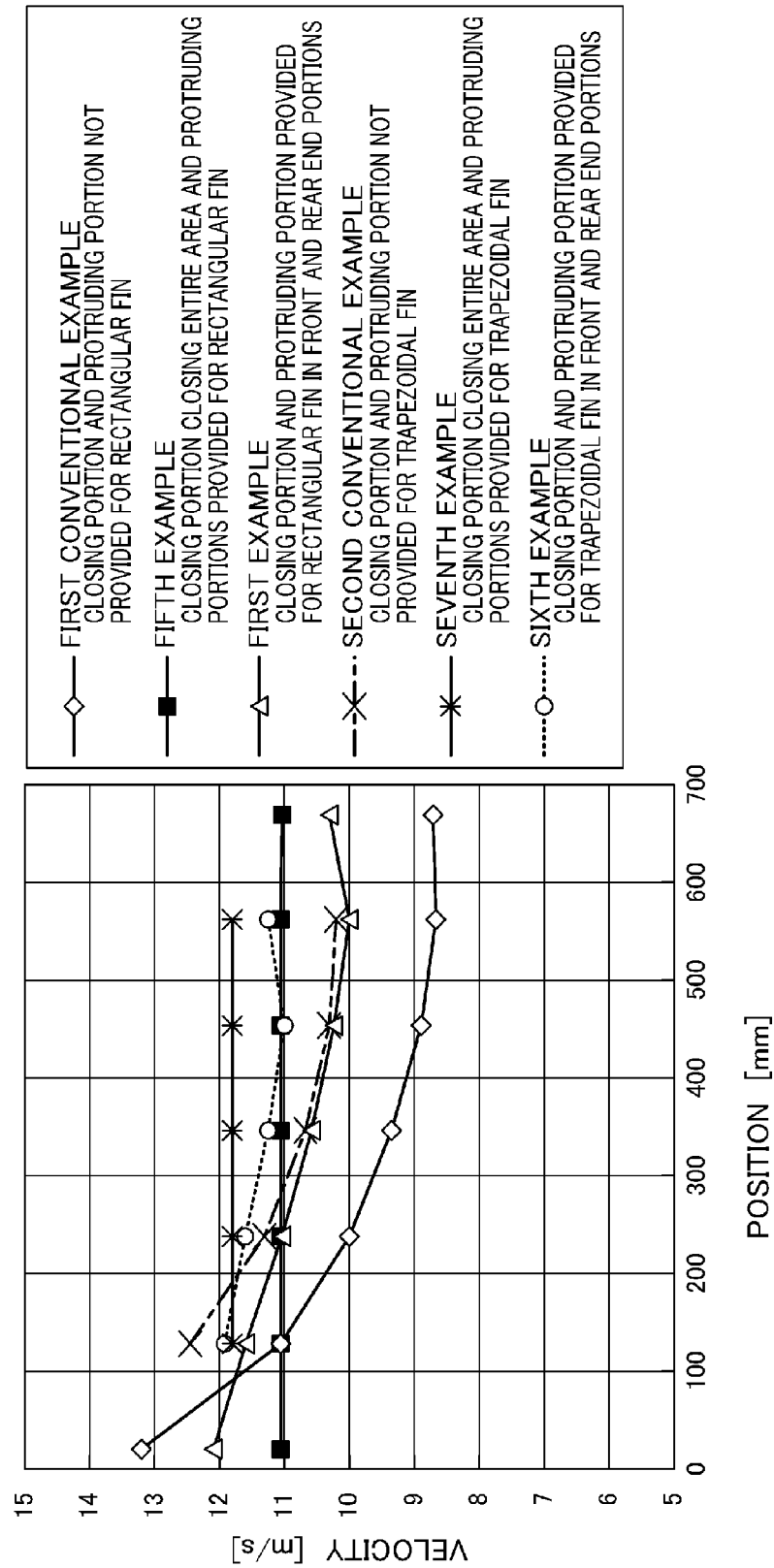
[FIG. 13]

FIG. 13 is a graph for comparing average airflow velocities in the YZ plane in the slit-shaped flow path, which were calculated for comparison of the flow field of the heat sink 1 in association with different fin shapes. As in the foregoing, a horizontal axis represents a position in the YZ plane, and a vertical axis represents an average airflow velocity (m/s). In this graph, the followings are compared to each other: the first conventional example (see FIG. 6) where the closing portion 41 and the protruding portion 42 are not provided for the rectangular fins 32; a second conventional example (not shown in the figure) where a closing portion 41 and a protruding portion 42 are not provided for trapezoidal fins 31 in each of which a front end edge and a rear end edge of the fin are inclined from a base end to an upstanding end at the same angle so as to extend toward the middle of the fin in the longitudinal direction; the first example (see FIG. 9) where the closing portion 41 and the protruding portion 42 are provided in each of the front end portion and the rear end portion of the heat dissipating portion including the rectangular fins 32; a fifth example (see FIG. 16) where a closing portion 41 and a protruding portion 42 are provided in each of a front end portion and a rear end portion of a heat dissipating portion including rectangular fins 32, and the closing portions 41 extending toward the middle of the fin close openings of slit-shaped flow paths 30 at an upstanding end across an entirety of the openings in the longitudinal direction; a sixth example (see FIGS. 14 and 15) where a closing portion 41 and a protruding portion 42 are provided in each of a front end portion and a rear end portion of a heat dissipating portion including trapezoidal fins 31; and a seventh example (not shown in the figure) where a closing portion 41 and a protruding portion 42 are provided in each of a front end portion and a rear end portion of a heat dissipating portion including trapezoidal fins 31, and the closing portions 41 extending toward the middle of the fin close openings of slit-shaped flow paths 30 at an upstanding end across an entirety of the openings in the longitudinal direction.

First, when comparing the first and second conventional examples in each of which the closing portion 41 and the protruding portion 42 are not provided, an airflow velocity value in the slit-shaped flow path 30 is larger in the second conventional example employing the trapezoidal fin 31 than in the first conventional example employing the rectangular fin 32. The airflow velocity is also decreased as air flows toward the rear end portion of the heat dissipating portion in the second conventional example. The degree of decrease in airflow velocity is high as in the first conventional example, and is substantially the same between the first and second conventional examples. A tendency in which the airflow velocity is higher in the trapezoidal fin 31 as compared to the rectangular fin 32, and, on the other hand, the degree of decrease in airflow velocity is substantially the same between the trapezoidal fin 31 and the rectangular fin 32 is similarly shown in comparison between the first and six examples and comparison between the fifth and seventh examples, i.e., in comparison between the examples having the same condition for the closing portion 41 and the protruding portion 42.

Figure 14:
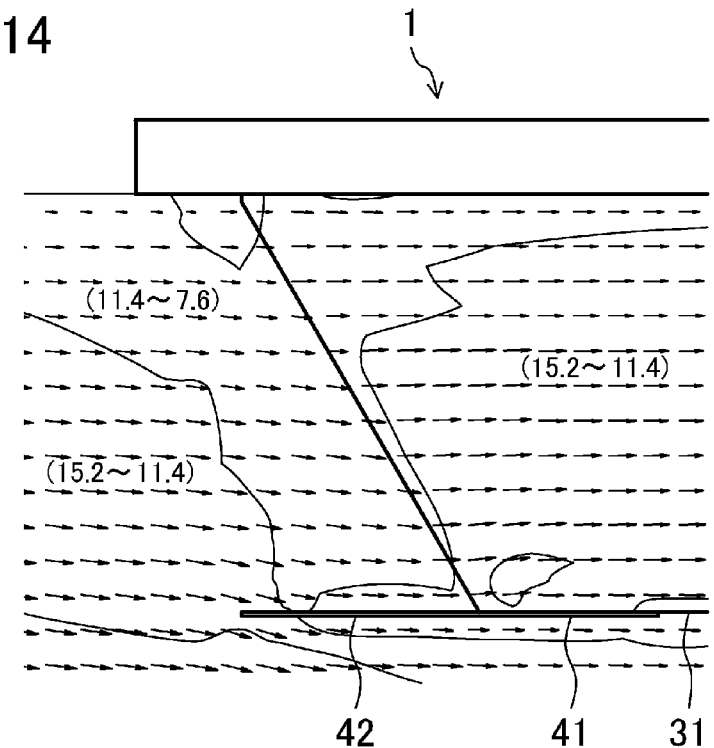
[FIG. 14]
Figure 15:
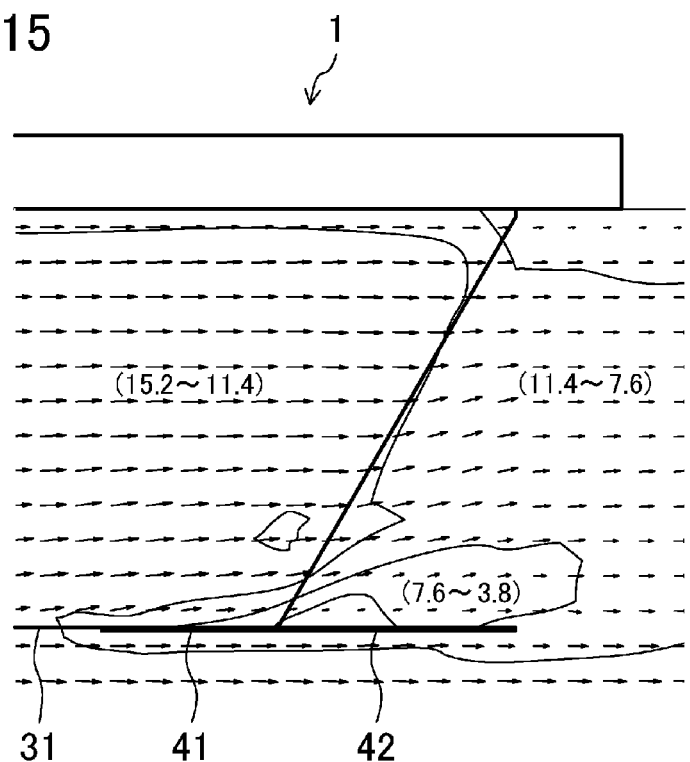
[FIG. 15]

When reviewing the first and sixth examples, the closing portion 41 and the protruding portion 42 are provided in each of the front end portion and the rear end portion of the heat dissipating portion 3 as described above, and therefore both of the function to suppress the decrease in airflow velocity and the function to increase the airflow velocity can be obtained regardless of whether the rectangular fin 32 or the trapezoidal fin 31 is employed. FIG. 14 is an enlarged view near the front end portion of the heat dissipating portion 3 corresponding to the results of the computational fluid dynamics of the sixth example, and FIG. 15 is an enlarged view near the rear end portion of the heat dissipating portion 3. As will be clearly seen from FIG. 14, in the heat dissipating portion of the trapezoidal fin 31, the closing portion 41 and the protruding portion 42 are provided in the front end portion of the heat dissipating portion. Thus, diverted air near the front end of the heat dissipating portion 3 contacts the closing portion 41 and the protruding portion 42, and then a flow direction is changed to the horizontal direction along the closing portion 41 and the protruding portion 42. It can be appreciated that the function to suppress the decrease in airflow velocity is obtained. In addition, as illustrated in FIG. 15, velocity vectors point upward particularly near the front end edge of the closing portion 41 by the closing portion 41 and the protruding portion 42 provided in the rear end portion of the heat dissipating portion 3, and then air flows in substantially the horizontal direction along the closing portion 41 and the protruding portion 42. As illustrated in FIGS. 9-11, such a tendency is similar to that of the first example where the closing portion 41 and the protruding portion 42 are provided in each of the front end portion and the rear end portion of the heat dissipating portion including the rectangular fins 32.

The trapezoidal fin 31 allows the relatively-high airflow velocity as described above. Thus, in the sixth example where the closing portion 41 and the protruding portion 42 are provided in each of the front end portion and the rear end portion of the heat dissipating portion including the trapezoidal fins 31, air flowing into the slit-shaped flow path 30 at the relatively-high airflow velocity flows toward the rear end of the slit-shaped flow path 30 in a state in which a decrease in airflow velocity of such air is suppressed, and then flows out from the slit-shaped flow path 30 in a state in which the airflow velocity of the air is slightly increased in the rear end portion of the heat dissipating portion.

Figure 16:
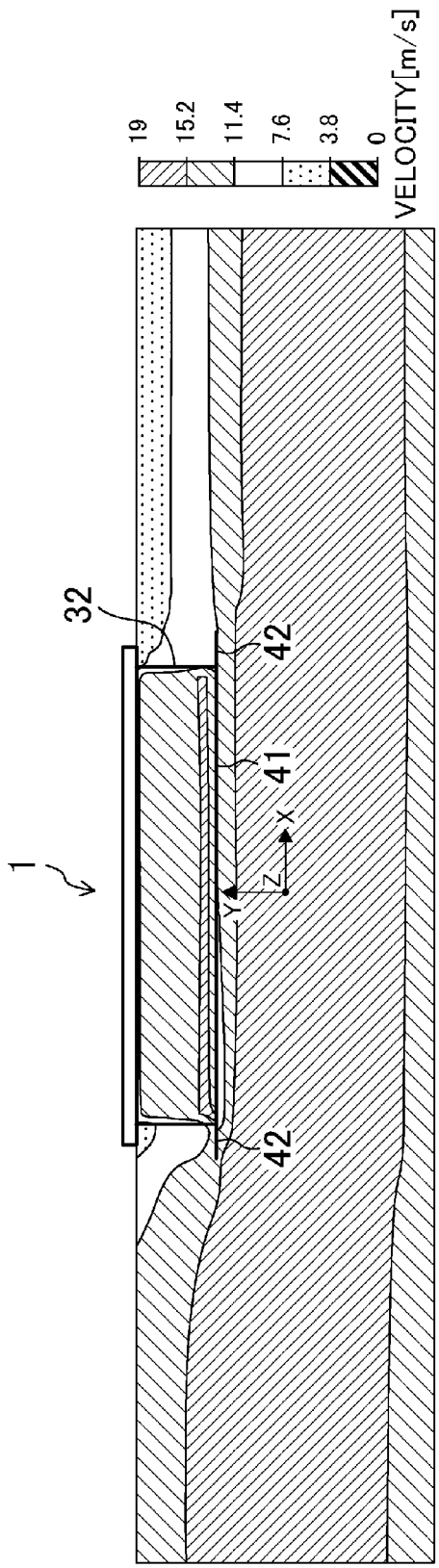
[FIG. 16]

As in the fifth and seventh examples, the openings of the slit-shaped flow paths 30 at the upstanding end are closed across the entirety of the openings in the longitudinal direction, thereby hardly decreasing the airflow velocity. This is because, by configuring the slit-shaped flow path 30 as a flow path opening only at front and rear ends (i.e., a closed flow path), air does not flow in/out through the opening of the slit-shaped flow path 30 at the upstanding end, and air flowing into the slit-shaped flow path 30 through the front end thereof flows out from the slit-shaped flow path 30 through the rear end thereof in a state in which the airflow velocity of such air is maintained. For example, FIG. 16 illustrates the results of the computational fluid dynamics in the fifth example. This figure clearly shows that a region where the airflow velocity is relatively high extends from the front end portion to the rear end portion of the heat dissipating portion 3, and the airflow velocity is hardly decreased.

Thus, when comparing the rectangular fin 32 and the trapezoidal fin 31, the airflow velocity is higher in the trapezoidal fin 31, and the trapezoidal fin 31 is advantageous to enhancement of cooling efficiency of the heat sink 1. In addition, the decrease in airflow velocity is suppressed by providing the closing portion 41 and the protruding portion 42 for the trapezoidal fins 31 (including closing the openings of the slit-shaped flow paths 30 at the upstanding end across the entirety of the openings in the longitudinal direction). Since the suppression of the decrease in airflow velocity is combined with the relatively-high airflow velocity, the trapezoidal fin 31 is more advantageous to the enhancement of the cooling efficiency of the heat sink 1. Even if the protruding portion 42 (and the closing portion 41) is/are provided for the trapezoidal fins 31, and a length of the trapezoidal fin 31 in the longitudinal direction is increased by the protruding portion 42 (and the closing portion 41), a length of the heat dissipating portion 3 and therefore an entire length of the heat sink 1 are substantially the same as that of, e.g., the heat sink including the rectangular fins 32 because a length of the trapezoidal fin 31 at the upstanding end is shortened in advance. That is, the trapezoidal fin 31 is advantageous to improvement of a cooling performance without an increase in size.

Figure 17:
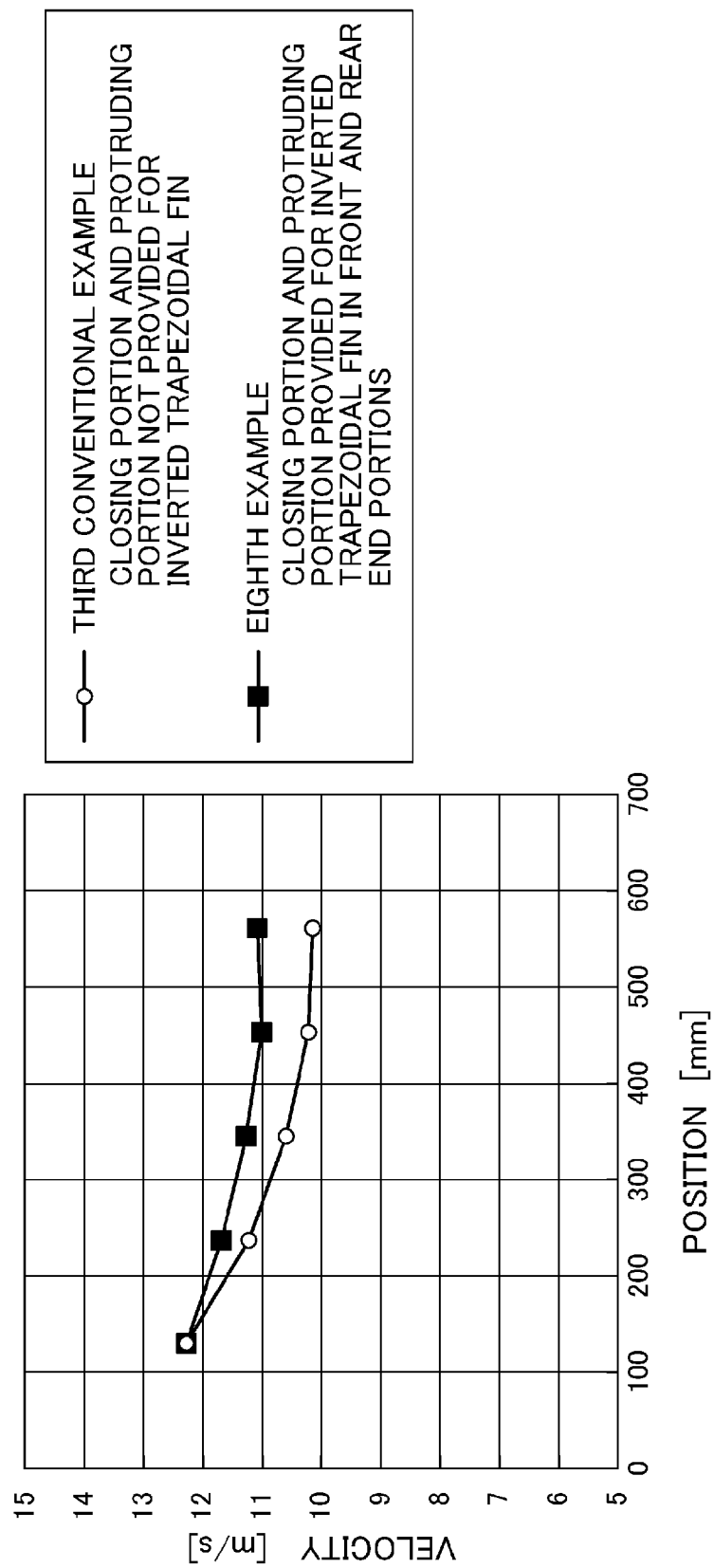
[FIG. 17]

FIG. 17 illustrates analytical results of a flow field around a heat sink 1 including inverted trapezoidal fins 33. FIG. 17 is a graph for comparing calculated average airflow velocities in the YZ plane in the slit-shaped flow path. Although not shown in the figure, the followings were compared to each other in this graph: a third conventional example where a closing portion 41 and a protruding portion 42 are not provided for inverted trapezoidal fins 33 in each of which a front end edge and a rear end edge of the fin 33 are inclined from a base end to an upstanding end at the same angle so as to outwardly extend in the longitudinal direction; and an eighth example where a closing portion 41 and a protruding portion 42 are provided in each of a front end portion and a rear end portion of a heat dissipating portion including inverted trapezoidal fins 33.

First, when comparing the third conventional example to the first conventional example (i.e., the example where the closing portion 41 and the protruding portion 42 are not provided for the rectangular fins 32) and the second conventional example (i.e., the example where the closing portion 41 and the protruding portion 42 are not provided for the trapezoidal fins 31) illustrated in FIG. 13 etc., the airflow velocity is higher in the third conventional example than in the first conventional example, and such a state is similar to the state when comparing the first and second conventional examples. In addition, in the third and second conventional examples, the airflow velocity is a little more than 12 m/s at a front end and about 10 m/s at a rear end. The airflow velocity value is substantially the same between the third and second conventional examples, and the degree of decrease in airflow velocity is also substantially the same. Thus, as in the trapezoidal fin 31, the inverted trapezoidal fin 33 also realizes the function to increase the airflow velocity as compared to the rectangular fin 32. On the other hand, only the inverted trapezoidal fin 33 cannot realize, e.g., the function to suppress the decrease in airflow velocity.

Next, when comparing the eighth example and the third conventional example, both of the function to suppress the decrease in airflow velocity and the function to increase the airflow velocity can be obtained in the eighth example where the closing portion 41 and the protruding portion 42 are provided in each of the front end portion and the rear end portion of the heat dissipating portion as in the rectangular fin 32 and the trapezoidal fin 31.

When comparing the trapezoidal fin 31 (see, e.g., the sixth example and FIG. 13) and the inverted trapezoidal fin 33 (see the eighth example), the airflow velocity value and the degree of decrease in airflow velocity are substantially the same between the trapezoidal fin 31 and the inverted trapezoidal fin 33, and there is no significant difference between the trapezoidal fin 31 and the inverted trapezoidal fin 33.

Figure 18:
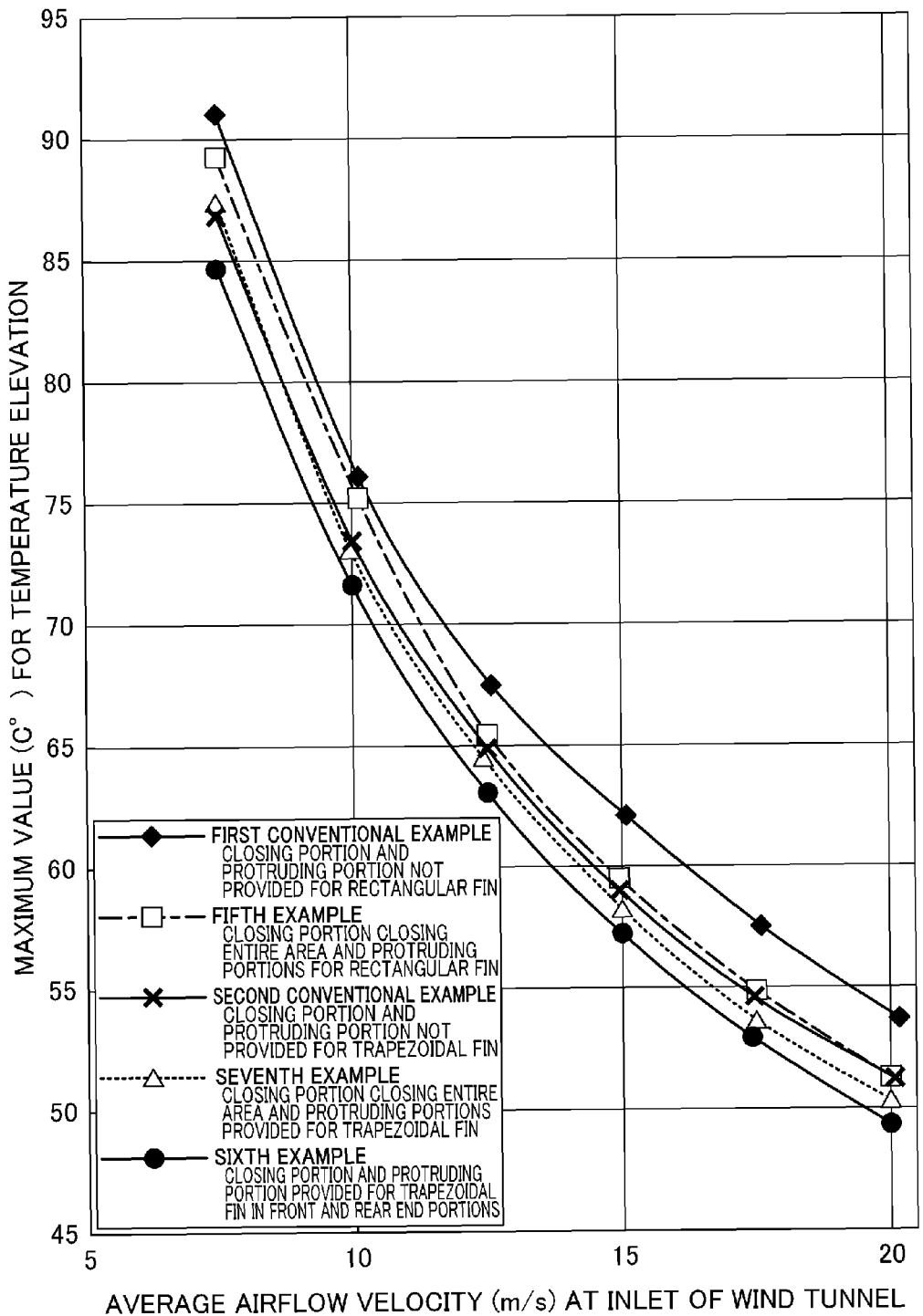
[FIG. 18]

Finally, measurement results of a cooling effect of the heat sink 1, which are obtained by measuring a temperature of a simulated heating element in a state in which the simulated heating element is attached to each of the various types of the heat sink 1, which have been actually produced, and the heat sink 1 is arranged in the wind tunnel will be described with reference to FIG. 18. In FIG. 18, the followings were compared to each other: the example (see the first conventional example and FIG. 6) where the closing portion 41 and the protruding portion 42 are not provided in the heat sink 1 including the rectangular fins 32; the example (see the fifth example and FIG. 16) where the closing portions 41 and the protruding portions 42 are provided in the heat sink 1 including the rectangular fins 32, and the extended closing portions 41 close the openings of the slit-shaped flow paths 30 at the upstanding end across the entirety of the openings in the longitudinal direction; the example (although not shown in the figure, see the second conventional example) where the closing portion 41 and the protruding portion 42 are not provided in the heat sink 1 including the trapezoidal fins 31; the example (although not shown in the figure, see the seventh example) where the closing portions 41 and the protruding portions 42 are provided in the heat sink 1 including the trapezoidal fins 31, and the extended closing portions 41 close the openings of the slit-shaped flow paths 30 at the upstanding end across the entirety of the openings in the longitudinal direction; and the example (see the sixth example and FIGS. 14 and 15) where the closing portions 41 and the protruding portions 42 are provided in the heat sink 1 including the trapezoidal fins 31. Although not shown in the figure, four simulated heating elements were attached to the heat sink 1 of each example in the longitudinal direction, and a temperature of the simulated heating element arranged in the middle of the heat sink 1 was measured.

In FIG. 18, a horizontal axis represents an average airflow velocity (m/s) at an inlet of the wind tunnel, and a vertical axis represents a maximum value (C.°) for temperature elevation of the heating element. FIG. 18 is for comparing the first and second conventional examples and the fifth, sixth, and seventh examples to each other. According to this graph, the first conventional example has the highest maximum value for temperature elevation for any airflow velocities, and therefore a level of the cooling effect is the lowest.

The results shows that the level of the cooling effect is the second lowest in the fifth example. As described above, if heat transfer is not taken into consideration, it is most effective for the function to suppress the decrease in airflow velocity by closing the openings of the slit-shaped flow paths 30 at the upstanding end across the entirety of the openings in the longitudinal direction. However, according to the measurement results, the cooling efficiency is not so high. It is assumed that this is because, even if the temperature in the slit-shaped flow path 30 is increased due to the heat transfer, and air density and air viscosity are changed, air does not flows in/out through the opening of the slit-shaped flow path 30 at the upstanding end, and therefore an adverse effect is provided on the airflow in the longitudinal direction. That is, since the temperature of the airflow in the slit-shaped flow path 30 is gradually increased from an inlet side (i.e., a front end) to an outlet side (i.e., a rear end) of the slit-shaped flow path 30, the air density is decreased in association with the temperature elevation, and, on the other hand, the air viscosity is increased. The decrease in air density (in other words, an increase in volume) results in an increase in volume flow rate, and the increase in air viscosity results in an increase in friction between air and the fin. Thus, resistance is increased as air flows toward the outlet side of the slit-shaped flow path 30. It is assumed that, if the openings of the slit-shaped flow paths 30 at the upstanding end are closed across the entirety of the openings in the longitudinal direction and each of the slit-shaped flow paths 30 opens at the front and rear ends as in the fifth example, a mass flow rate of air taken into the heat sink is decreased due to the increase in resistance on the outlet side, and therefore the cooling efficiency of the heat sink is degraded. As in the foregoing, in the comparison between the seventh and sixth examples, the cooling efficiency is lower in the seventh example where the openings of the slit-shaped flow paths 30 at the upstanding end are closed across the entirety of the openings in the longitudinal direction than in the sixth example where only the front end portion and the rear end portion of the heat dissipating portion 3 are closed.

However, in the fifth example, a higher airflow velocity results in a lower maximum value for temperature elevation, and the cooling effect similar to that of, e.g., the second conventional example can be obtained at an airflow velocity of 20 m/s. The same applies to the comparison between the seventh and sixth examples in this regard. When the airflow velocity is relatively low (e.g., 7.5 m/s), a difference in maximum value for temperature elevation between the seventh and sixth examples is about 3 C.°. On the other hand, when the airflow velocity is relatively high (e.g., 20 m/s), the difference in maximum value for temperature elevation between the seventh and sixth examples is reduced to about 1 C.°. Thus, if the openings of the slit-shaped flow paths 30 at the upstanding end are closed across the entirety of the openings in the longitudinal direction as in the fifth and seventh examples, there is a possibility that the cooling effect can be sufficiently obtained, e.g., under a low thermal load under which an air temperature elevation rate (i.e., a change in property value) from the inlet side to the outlet side of the slit-shaped flow path 30 is low, or in a flow field where the airflow velocity is high.

In the sixth example where the closing portions 41 and the protruding portions 42 are provided in the heat sink 1 including the trapezoidal fins 31, the maximum value for temperature elevation is the lowest, and therefore the cooling efficiency is the highest. It is assumed that this is because the function to obtain the high airflow velocity by the trapezoidal fin 31, the function to suppress the decrease in airflow velocity by the closing portion 41 and the protruding portion 42 provided in the front end portion of the heat dissipating portion 3, and the function to increase the airflow velocity by the closing portion 41 and the protruding portion 42 provided in the rear end portion of the heat dissipating portion 3 are combined as described above.

Industrial Applicability

As described above, according to the present invention, the heat sink can be realized, which has the high level of the cooling effect. Thus, the present invention is useful for the heat sink mounted in the movable body and configured to cool various units by using the traveling air stream.

DESCRIPTION OF REFERENCE CHARACTERS

1 Heat Sink
11 Base
111 Attachment Surface
112 Heat Dissipation Surface
2 Power Semiconductor Device (Heating Element)
3 Heat Dissipating Portion
30 Slit-Shaped Flow Path
31, 32, 33 Fin
41 Closing Portion (Rectifying Portion)
42 Protruding Portion (Rectifying Portion)
91 Railway Vehicle (Movable Body)

The invention claimed is:

1. A heat sink which is mounted in a movable body and is to be exposed to a traveling air stream generated while the movable body moves, comprising:
   a base which has an attachment surface and a heat dissipation surface and to which at least one heating element is attached at the attachment surface; and
   a heat dissipating portion including a plurality of fins each vertically arranged on the heat dissipation surface of the base,
   wherein each of the plurality of fins extends from a base end contacting the heat dissipation surface to an upstanding end so as to protrude from the heat dissipation surface, and extends in a longitudinal direction from a front end corresponding to an upstream end in a flow direction of the traveling air stream to a rear end corresponding to a downstream end,
   in the heat dissipating portion, the plurality of fins are arranged so as to be apart from each other at a predetermined interval in an arrangement direction perpendicular to the longitudinal direction, and a plurality of slit-shaped flow paths opening at the front end, the rear end, and the upstanding end of the plurality of fins are formed so that each of the plurality of slit-shaped flow paths extends in the longitudinal direction between adjacent ones of the plurality of fins,
   the heat dissipating portion further includes a rectifying portion which is provided so as to extend across a predetermined area in the longitudinal direction in front portions of the plurality of fins at the upstanding end, and
   the rectifying portion is a flat plate-shaped protruding portion protruding straight from the front portions of the plurality of fins at the upstanding end toward a front in the longitudinal direction and extending in the arrangement direction in front of and between adjacent ones of the plurality of fins.

2. The heat sink of claim 1, wherein
   the rectifying portion is a flat plate-shaped rectifying portion which extends toward back and front with respect to a front end edge of the heat dissipating portion to close openings of the slit-shaped flow paths at the upstanding end in at least a front end portion of the heat dissipating portion, and which protrudes straight from front end edges of the plurality of fins toward front in the longitudinal direction.

3. The heat sink of claim 1, wherein the heat dissipating portion further includes a rectifying portion attached to a rear end side of the heat dissipating portion.

4. The heat sink of claim 3, wherein
the rectifying portion is attached to each of a front end side and the rear end side of the heat dissipating portion so that the heat dissipating portion has a symmetrical shape in the longitudinal direction.

5. The heat sink of claim 1, wherein
each of the plurality of fins is formed in a trapezoidal shape in which each of the front end edge and a rear end edge of the each of the plurality of fins is inclined from the base end to the upstanding end so as to extend toward the middle of the each of the plurality of fins in the longitudinal direction, and the each of the plurality of fins is symmetric in the longitudinal direction.

6. The heat sink of claim 2, wherein
the heat dissipating portion further includes a rectifying portion attached to a rear end side of the heat dissipating portion.

7. The heat sink of claim 6, wherein
the rectifying portion is attached to each of a front end side and the rear end side of the heat dissipating portion so that the heat dissipating portion has a shape symmetric in the longitudinal direction.

8. The heat sink of claim 2, wherein
each of the plurality of fins is formed in a trapezoidal shape symmetric in the longitudinal direction, in which each of the front end edge and a rear end edge of the each of the plurality of fins is inclined from the base end to the upstanding end so as to extend toward the middle of the each of the plurality of fins in the longitudinal direction.

9. The heat sink of claim 3, wherein
each of the plurality of fins is formed in a trapezoidal shape symmetric in the longitudinal direction, in which each of the front end edge and a rear end edge of the each of the plurality of fins is inclined from the base end to the upstanding end so as to extend toward the middle of the each of the plurality of fins in the longitudinal direction.

10. The heat sink of claim 4, wherein
each of the plurality of fins is formed in a trapezoidal shape symmetric in the longitudinal direction, in which each of the front end edge and a rear end edge of the each of the plurality of fins is inclined from the base end to the upstanding end so as to extend toward the middle of the each of the plurality of fins in the longitudinal direction.

11. The heat sink of claim 6, wherein
each of the plurality of fins is formed in a trapezoidal shape symmetric in the longitudinal direction, in which each of the front end edge and a rear end edge of the each of the plurality of fins is inclined from the base end to the upstanding end so as to extend toward the middle of the each of the plurality of fins in the longitudinal direction.

12. The heat sink of claim 7, wherein
each of the plurality of fins is formed in a trapezoidal shape symmetric in the longitudinal direction, in which each of the front end edge and a rear end edge of the each of the plurality of fins is inclined from the base end to the upstanding end so as to extend toward the middle of the each of the plurality of fins in the longitudinal direction.

* * * * *